(12) United States Patent
Seo

(10) Patent No.: US 9,202,531 B2
(45) Date of Patent: Dec. 1, 2015

(54) SENSOR AMPLIFIER, MEMORY DEVICE COMPRISING SAME, AND RELATED METHOD OF OPERATION

(71) Applicant: SAMSUNG ELECTRONICS CO., LTD., Suwon-Si, Gyeonggi-Do (KR)

(72) Inventor: Younghun Seo, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/264,466

(22) Filed: Apr. 29, 2014

(65) Prior Publication Data
US 2015/0036444 A1  Feb. 5, 2015

(30) Foreign Application Priority Data

Aug. 1, 2013  (KR) .......................... 10-2013-0091682

(51) Int. Cl.
*G11C 7/02* (2006.01)
*G11C 7/06* (2006.01)
*G11C 11/4091* (2006.01)

(52) U.S. Cl.
CPC ............ *G11C 7/065* (2013.01); *G11C 11/4091* (2013.01); *G11C 2207/002* (2013.01)

(58) Field of Classification Search
CPC ............................ G11C 11/4091; G11C 7/065
USPC ........................................ 365/210.1, 205, 149
See application file for complete search history.

(56) References Cited

U.S. PATENT DOCUMENTS

| | | | | |
|---|---|---|---|---|
| 6,584,026 B2* | 6/2003 | Kawasumi | ..................... | 365/205 |
| 2006/0092738 A1* | 5/2006 | Kang et al. | ..................... | 365/210 |

* cited by examiner

*Primary Examiner* — Huan Hoang
(74) *Attorney, Agent, or Firm* — Volentine & Whitt, PLLC

(57) ABSTRACT

A sense amplifier includes a sense amplifying unit configured to be connected to a bitline and a complimentary bitline of a memory device, to sense a voltage change of the bitline in response to first and second control signals, and to control voltages of a sensing bitline and a complimentary sensing bitline based on the sensed voltage change. The sense amplifier further includes a first isolation switch configured to connect the bitline with the sensing bitline in response to an isolation signal, a second isolation switch configured to connect the complimentary bitline with the complimentary sensing bitline in response to the isolation signal, a first offset cancellation switch configured to connect the bitline with the sensing bitline in response to an offset cancellation signal, and a second offset cancellation switch configured to connect the complimentary bitline with the complimentary sensing bitline in response to the offset cancellation signal.

13 Claims, 25 Drawing Sheets

[Precharging Operation]

[Offset Cancelling Operation]

[Charge Sharing Operation]

SENSOR AMPLIFIER, MEMORY DEVICE COMPRISING SAME, AND RELATED METHOD OF OPERATION

CROSS-REFERENCE TO RELATED APPLICATIONS

This application claims priority under 35 U.S.C. §119 to Korean Patent Application No. 10-2013-0091682 filed on Aug. 1, 2013, the subject matter of which is hereby incorporated by reference.

BACKGROUND OF THE INVENTION

The inventive concept relates generally to semiconductor memory devices, and more particularly to a sense amplifier that senses and amplifies data of a semiconductor memory device.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include static random access memory (SRAM), dynamic RAM (DRAM), and synchronous DRAM (SDRAM). Examples of nonvolatile memory devices include read only memory (ROM), programmable ROM (PROM), electrically programmable ROM (EPROM), electrically erasable and programmable ROM (EEPROM), NAND flash memory, NOR flash memory, phase-change RAM (PRAM), magnetic RAM (MRAM), resistive RAM (RRAM), and ferroelectric RAM (FRAM).

In a typical DRAM, a memory cell array is connected to a bitline BL and a complementary bitline BLB. In a read operation (or a refresh operation), a sense amplifier senses a voltage difference between a bitline BL and a complementary bitline BLB and amplifies the voltage difference.

The sense amplifier typically comprises various types of semiconductor devices, which can have different characteristics (e.g., threshold voltages) due to process variation and temperature. These different characteristics may generate offset noise in the sense amplifier. Additionally, coupling noise may occur due to coupling between bitlines. An effective sensing margin of the sense amplifier may be reduced due to the offset noise and the coupling noise, degrading performance of a DRAM device.

SUMMARY OF THE INVENTION

In one embodiment of the inventive concept, a sense amplifier comprises a sense amplifying unit configured to be connected to a bitline and a complimentary bitline of a memory device, to sense a voltage change of the bitline in response to first and second control signals, and to control voltages of a sensing bitline and a complimentary sensing bitline based on the sensed voltage change. It further comprises a first isolation switch configured to connect the bitline with the sensing bitline in response to an isolation signal, a second isolation switch configured to connect the complimentary bitline with the complimentary sensing bitline in response to the isolation signal, a first offset cancellation switch configured to connect the bitline with the sensing bitline in response to an offset cancellation signal, and a second offset cancellation switch configured to connect the complimentary bitline with the complimentary sensing bitline in response to the offset cancellation signal.

In another embodiment of the inventive concept, a memory device comprises a memory cell array comprising multiple memory blocks, multiple sense amplifiers configured to be connected to the memory blocks and having an open bitline structure, and a reference voltage unit disposed at an edge area of the memory cell array and connected to sense amplifiers adjacent to the edge area among the sense amplifiers. Each of the sense amplifiers comprises a sense amplifying unit configured to be connected to a bitline and a complimentary bitline, to sense a voltage change of the bitline in response to first and second control signals, and to control voltages of a sensing bitline and a complimentary sensing bitline based on the sensed voltage change, a first isolation switch configured to connect the bitline with the sensing bitline in response to an isolation signal, a second isolation switch configured to connect the complimentary bitline with the complimentary sensing bitline in response to the isolation signal, a first offset cancellation switch configured to connect the bitline with the sensing bitline in response to an offset cancellation signal, and a second offset cancellation switch configured to the complimentary bitline with the complimentary sensing bitline in response to the offset cancellation signal.

In another embodiment of the inventive concept, a method is provided for operating a sense amplifier connected to a bitline and a complimentary bitline of a memory device. The method comprises performing an offset cancelling operation according to an isolation signal, an offset cancellation signal, and first and second control signals to sense a voltage change of the bitline, and performing a pre-sensing operation according to the isolation signal, the offset cancellation signal, and the first and second control signals to control voltages of a sensing bitline and a complimentary sensing bitline based on the sensed voltage change. The offset cancelling operation is an operation where the bitline is charged or discharged by an offset. The pre-sensing operation is an operation amplifying or reducing voltage levels of the sensing bitline and the complimentary sensing bitline on the basis of the voltage variation of the bitline.

These and other embodiments of the inventive concept can potentially increase an effective sensing margin of a memory device by operating a sense amplifier with an offset cancelling operation to compensate for offsets of devices in the sense amplifier and a pre-sensing operation to reduce coupling efficiency between bitlines.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In the description that follows, the terms "first", "second", "third", etc., may be used to describe various features, but the described features should not be limited by these terms. Rather, these terms are used merely to distinguish between different features. Thus, a first feature could be termed a second feature and vice versa without departing from the teachings of this description.

The terminology used herein is for the purpose of describing particular embodiments only and is not intended to be limiting of the inventive concept. As used herein, the singular forms "a", "an" and "the" are intended to encompass the plural forms as well, unless the context clearly indicates otherwise. Terms such as "comprises", "comprising," "includes," "including," etc., where used in this specification, specify the presence of stated features but do not preclude the presence or addition of one or more other features. As used herein, the term "and/or" encompasses any and all combinations of one or more of the associated listed items.

Where a feature is referred to as being "on", "connected to" or "adjacent to" another feature, it can be directly on, connected or adjacent to the other feature, or intervening features may be present. In contrast, where a feature is referred to as being "directly on" or "directly connected to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or this specification and will not be interpreted in an idealized or overly formal sense unless expressly so defined herein.

According to some embodiments of the inventive concept, a sense amplifier operates based on an offset cancelation operation, a charge share operation, a pre-sensing operation, and a restore operation. The sense amplifier can perform the offset cancelling operation to compensate for offsets of devices in the sense amplifier, and it can reduce coupling efficiency between bitlines through the pre-sensing operation. Accordingly, the sense amplifier can increase an effective sensing margin of a memory device.

Figure 1:
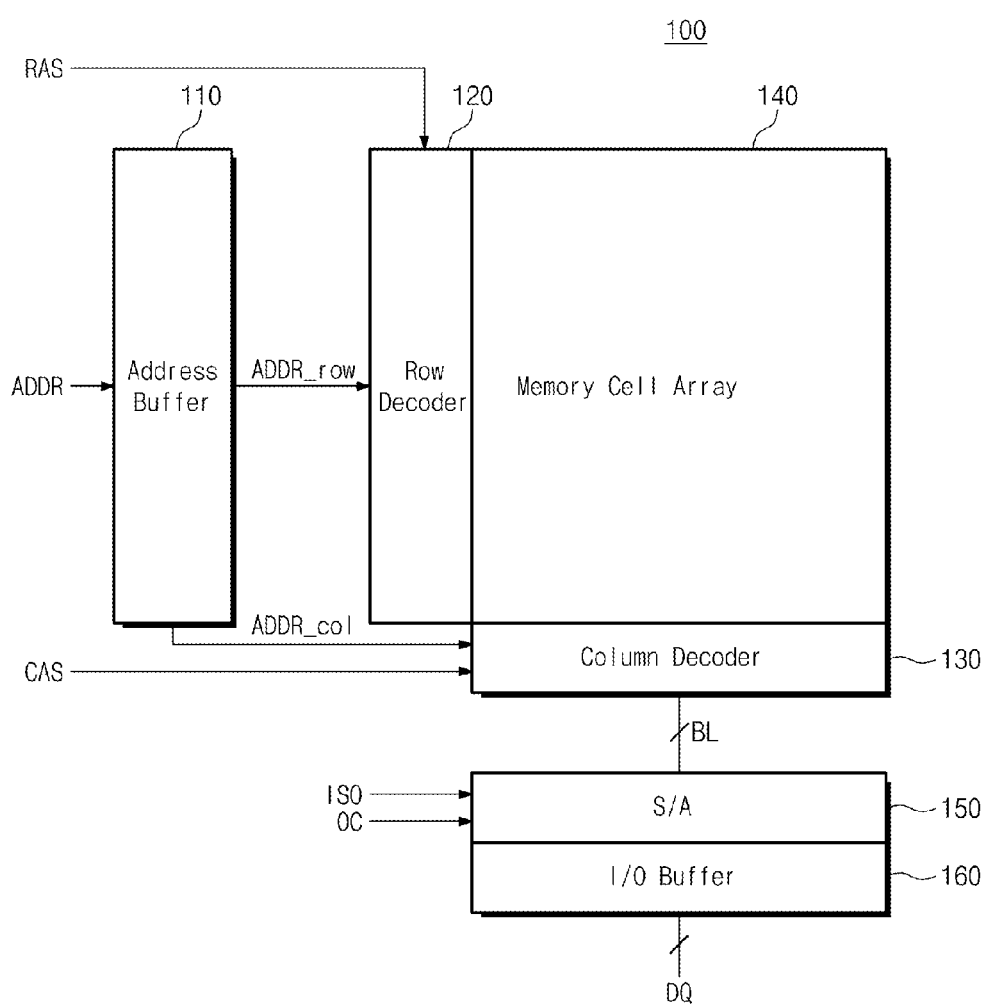
FIG. 1 is a block diagram illustrating a memory device according to an embodiment of the inventive concept.

FIG. 1 is a block diagram illustrating a memory device 100 according to an embodiment of the inventive concept. Memory device 100 may be, for instance, a DRAM, an SDRAM, an SRAM, a DDR SDRAM, a DDR2 SDRAM, a DDR3 SDRAM, a PRAM, an MRAM, or an RRAM.

Referring to FIG. 1, memory device 100 comprises an address buffer 110, a row decoder 120, a column decoder 130, a memory cell array 140, a sense amplifier 150 and an input/output buffer 160. Memory device 100 outputs data through data lines DQ in response to an address ADDR and control signals (RAS, CAS) received from an external device, such as a memory controller.

Address buffer 110 receives address ADDR from the external device. Address ADDR comprises a row address (ADDR_row) indicating a row of memory cell array 140, and a column address (ADDR_col) indicating a column of memory cell array 140. Address buffer 110 transmits a row address (ADDR_row) to row decoder 120. Address buffer 110 can transmit a column address (ADDR_col) to column decoder 130.

Row decoder 120 selects at least one of multiple wordlines connected to memory cell array 140 based on a row address ADDR_row received from address buffer 110. Row decoder 120 activates the selected wordline in response to a control signal RAS.

Column decoder 130 selects at least one of multiple bitlines BL connected to memory cell array 140. Column decoder 130 receives a column address ADDR_col from address buffer 110. Column decoder 130 selects one bitline corresponding to the received column address ADDR_col among the bitlines. Column decoder 130 activates the selected bitline in response to control signal CAS.

Memory cell array 140 comprises memory cells connected to wordlines and bitlines. The wordlines are connected to rows of the memory cells of memory cell array 140, and the bitlines are connected to columns of the memory cells of memory cell array 140.

Sense amplifier 150 is connected to the bitlines connected to memory cell array 140. Sense amplifier 150 senses a voltage change of an activated bitline among the bitlines and amplifies the voltage change to produce output data. Input/output buffer 160 outputs data to an external device through data lines DQ on the basis of the voltage amplified by sense amplifier 150.

Sense amplifier 150 receives an isolation signal ISO and an offset cancellation signal OC from control logic (not shown) and the external device. Sense amplifier 150 performs an offset cancelling operation and a pre-sensing operation according to the received isolation signal ISO and offset cancellation signal OC. The offset indicates a characteristic (e.g., a threshold voltage) difference between devices in sense amplifier 150.

Isolation signal ISO and offset cancellation signal OC can control multiple switches in sense amplifier 150. Where switches that operate under control of isolation signal ISO are turned off and switches that operate under control of offset cancellation signal OC are turned on, sense amplifier 150 performs an offset cancelling operation. Where switches that operate under control of isolation signal ISO and switches that operate under control of offset cancellation signal OC are turned off, sense amplifier 150 performs a pre-sensing operation.

Sense amplifier 150 compensates for an offset of sense amplifier 150 and coupling between bitlines BL, which tends to increase an effective sensing margin of a bitline.

Figure 2:
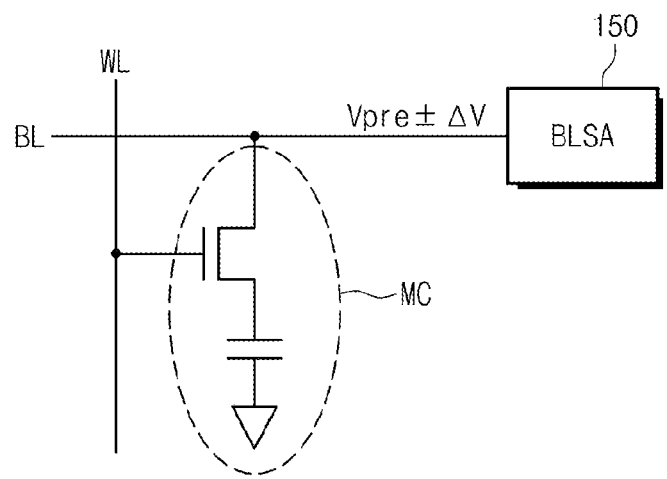
FIG. 2 is a drawing for explaining a sensing operation of a sense amplifier illustrated in FIG. 1, according to an embodiment of the inventive concept.
Figure 3:
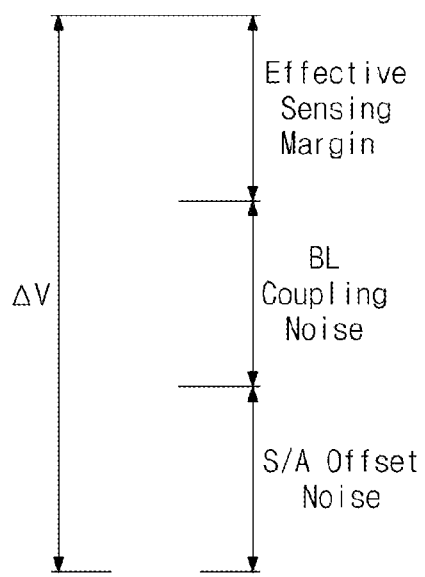
FIG. 3 is a drawing for explaining the sensing operation of FIG. 2, according to an embodiment of the inventive concept.

FIGS. 2 and 3 are drawings for describing a sensing operation of a sense amplifier illustrated in FIG. 1, according to an embodiment of the inventive concept. For convenience, FIGS. 2 and 3 will be described with respect to a refresh operation of memory device 100, although the inventive concept is not limited to refresh operations.

Referring to FIGS. 1 to 3, memory device 100 performs a refresh operation based on a quantity of charges stored in a capacitor in a memory cell MC. A bitline BL connected to memory cell MC is precharged to a precharge voltage Vpre. Then, as a wordline WL is activated, charge sharing occurs between charges of bitline BL charged to the precharge voltage Vpre and charges of a capacitor of memory cell MC. A bitline voltage VBL increases or decreases by a voltage variation ΔV due to the charge sharing.

Sense amplifier 150 senses and amplifies the voltage variation ΔV. In this case, an effective sensing margin of sense amplifier 150 is such as that illustrated in FIG. 3 due to a bitline coupling noise, an offset noise of sense amplifier, etc. Where the voltage variation ΔV is below a certain level, sense amplifier 150 cannot sense the voltage variation ΔV of bitline BL.

Sense amplifier 150 reduces bitline coupling noise and sense amplifier offset noise by performing an offset cancelling operation and a pre-sensing operation in response to isolation signal ISO and an offset cancellation signal OC.

Figure 4:
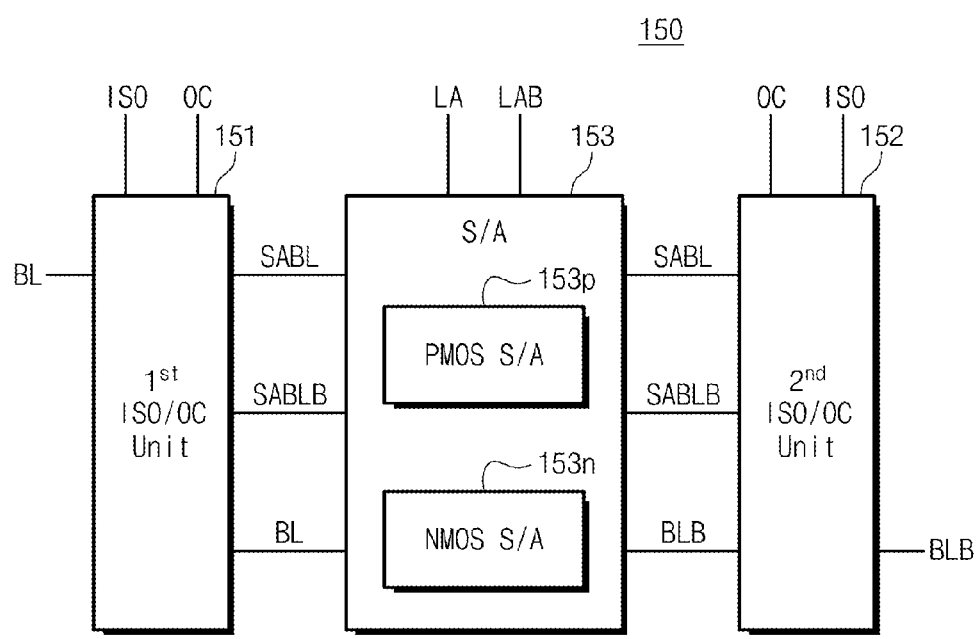
FIG. 4 is a block diagram illustrating the sense amplifier illustrated in FIG. 1, according to an embodiment of the inventive concept.

FIG. 4 is a block diagram illustrating the sense amplifier of FIG. 1, according to an embodiment of the inventive concept. For simplicity, features that are not needed to explain the operation of sense amplifier 150 are omitted from the description and drawing. In a typical implementation, however, the sense amplifier may further comprise additional features such as a pre-charging circuit, an equivalent circuit, etc.

Referring to FIG. 4, sense amplifier 150 comprises first and second isolation/offset cancellation units 151 and 152 and a sense amplifying unit 153. First isolation/offset cancellation unit 151 is connected to a bitline BL, a sensing bitline SABL and a complementary sensing bitline SABLB. Second isolation/offset cancellation unit 152 is connected to a complementary bitline BLB, a sensing bitline SABL and a complementary sensing bitline SABLB. First and second isolation/offset cancellation units 151 and 152 receive an isolation signal ISO and an offset cancellation signal OC and operate based on the received isolation signal ISO and offset cancellation signal OC.

First isolation/offset cancellation unit 151 cuts off a connection between bitline BL and sensing bitline SABL in response to isolation signal ISO. First isolation/offset cancellation unit 151 cuts off a connection between bitline BL and complementary sensing bitline SABLB in response to offset cancellation signal OC. Second isolation/offset cancellation unit 152 can cut off a connection between complementary bitline BLB and complementary sensing bitline SABLB in response to isolation signal ISO. Second isolation/offset cancellation unit 152 cuts off a connection between complementary bitline BLB and sensing bitline SABL in response to offset cancellation signal OC.

Sense amplifying unit 153 comprises a PMOS sense amplifying unit 153p and an NMOS sense amplifying unit 153n. Sense amplifying unit 153 senses and amplifies a voltage difference between bitline BL and complementary bitline BLB in response to first and second control signals LA and LAB. In some embodiments, NMOS sense amplifying unit 153n is directly connected to bitline BL and complementary bitline BLB. Gates of transistors in NMOS sense amplifying unit 153n are each connected to bitline BL and complementary bitline BLB.

Figure 5:
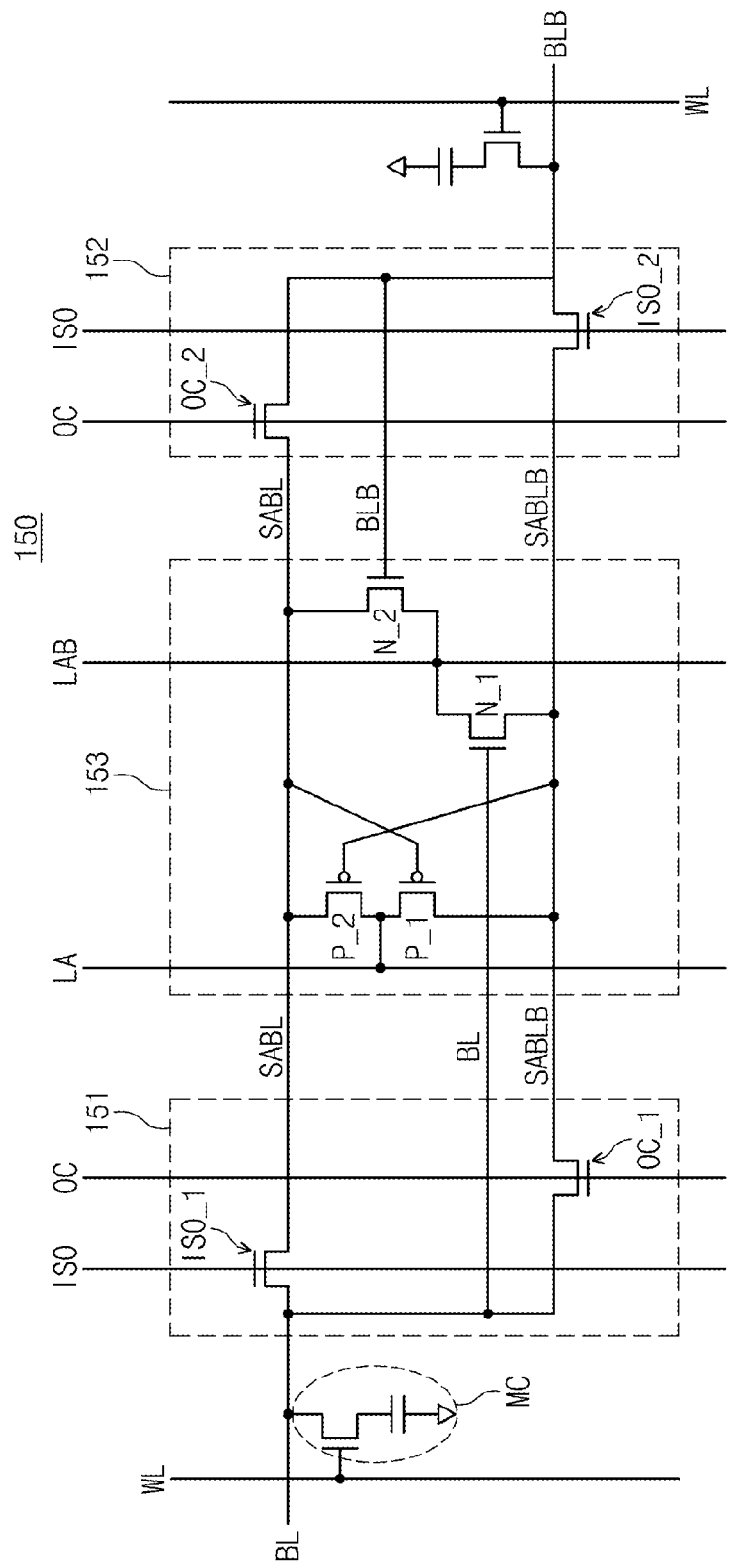
FIG. 5 is a circuit diagram illustrating the sense amplifier illustrated in FIG. 4, according to an embodiment of the inventive concept.
Figure 6:
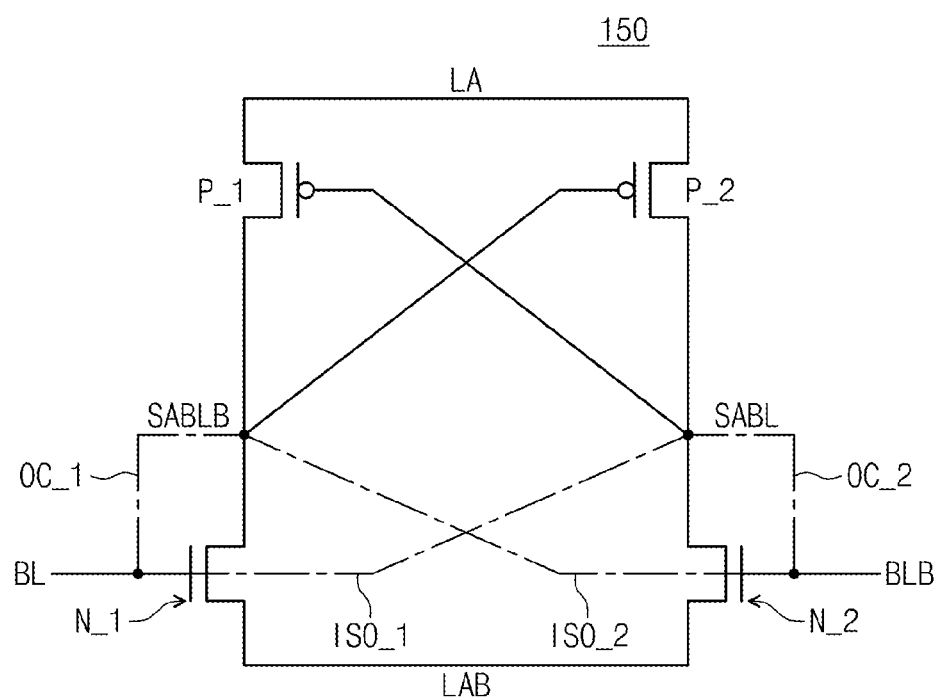
FIG. 6 is an equivalent circuit of the sense amplifier illustrated in FIG. 5, according to an embodiment of the inventive concept.

FIG. 5 is a circuit diagram illustrating the sense amplifier illustrated in FIG. 4, according to an embodiment of the inventive concept. FIG. 6 is an equivalent circuit of the sense amplifier illustrated in FIG. 5.

Referring to FIGS. 4 and 5, sense amplifier 150 comprises first and second isolation/offset cancellation units 151 and 152 and sense amplifying unit 153.

First isolation/offset cancellation unit 151 comprises a first isolation switch ISO_1 and a first offset cancellation switch OC_1. One end of first isolation switch ISO_1 is connected to a bitline BL and the other end of first isolation switch ISO_1 is connected to a sensing bitline SABL. First isolation switch ISO_1 operates according to isolation signal ISO. One end of the first offset cancellation switch OC_1 is connected to bitline BL and the other end of the first offset cancellation switch OC_1 is connected to a complementary sensing bitline SABLB. The first offset cancellation switch OC_1 operates according to offset cancellation signal OC.

Second isolation/offset cancellation unit 152 comprises a second isolation switch ISO_2 and a second offset cancellation switch OC_2. One end of second isolation switch ISO_2 is connected to a complementary bitline BLB and the other end of second isolation switch ISO_2 is connected to a complementary sensing bitline SABLB. Second isolation switch ISO_2 operates according to isolation signal ISO. One end of second offset cancellation switch OC_2 is connected to complementary bitline BLB and the other end of second offset cancellation switch OC_2 is connected to sensing bitline SABL. Second offset cancellation switch OC_2 operates according to offset cancellation signal OC.

Sense amplifying unit 153 comprises first and second PMOS transistors P_1 and P_2 and first and second NMOS transistors N_1 and N_2. In some embodiments, PMOS sense amplifying unit 153p comprises first and second PMOS transistors P_1 and P_2. NMOS sense amplifying unit 153n comprises first and second NMOS transistors N_1 and N_2.

One end of first PMOS transistor P_1 is connected to complementary sensing bitline SABLB, the other end of first PMOS transistor P_1 is connected to a line of first control signal LA and a gate of first PMOS transistor P_1 is connected to sensing bitline SABL. One end of second PMOS transistor P_2 is connected to sensing bitline SABL, the other end of second PMOS transistor P_2 is connected to the line of first control signal LA and a gate of second PMOS transistor P_2 is connected to complementary sensing bitline SABLB.

One end of first NMOS transistor N_1 is connected to complementary sensing bitline SABLB, the other end of first NMOS transistor N_1 is connected to a line of second control signal LAB and a gate of first NMOS transistor N_1 is connected to bitline BL. One end of second NMOS transistor N_2 is connected to sensing bitline SABL, the other end of second NMOS transistor N_2 is connected to the line of second control signal LAB and a gate of second NMOS transistor N_2 is connected to complementary bitline BLB.

Bitline BL is connected to one end of a driving switch in memory cell MC. The wordline is connected to a gate of the driving switch in memory cell MC.

Referring to FIG. 6, a sense amplifier 150 illustrated in FIG. 6 is an equivalent circuit which is the same as sense amplifier 150 illustrated in FIG. 5. In FIG. 6, first and second isolation switches ISO_1 and ISO_2 and the first and second offset cancellation switches OC_1 and OC_2 are indicated by broken lines.

Sense amplifier 150 illustrated in FIGS. 5 and 6 sequentially performs a precharging operation, an offset cancelling operation, a charge sharing operation, a pre-sensing operation, and a restoring operation based on isolation signal ISO, offset cancellation signal OC, and first and second control signals LA and LAB.

Figure 7:
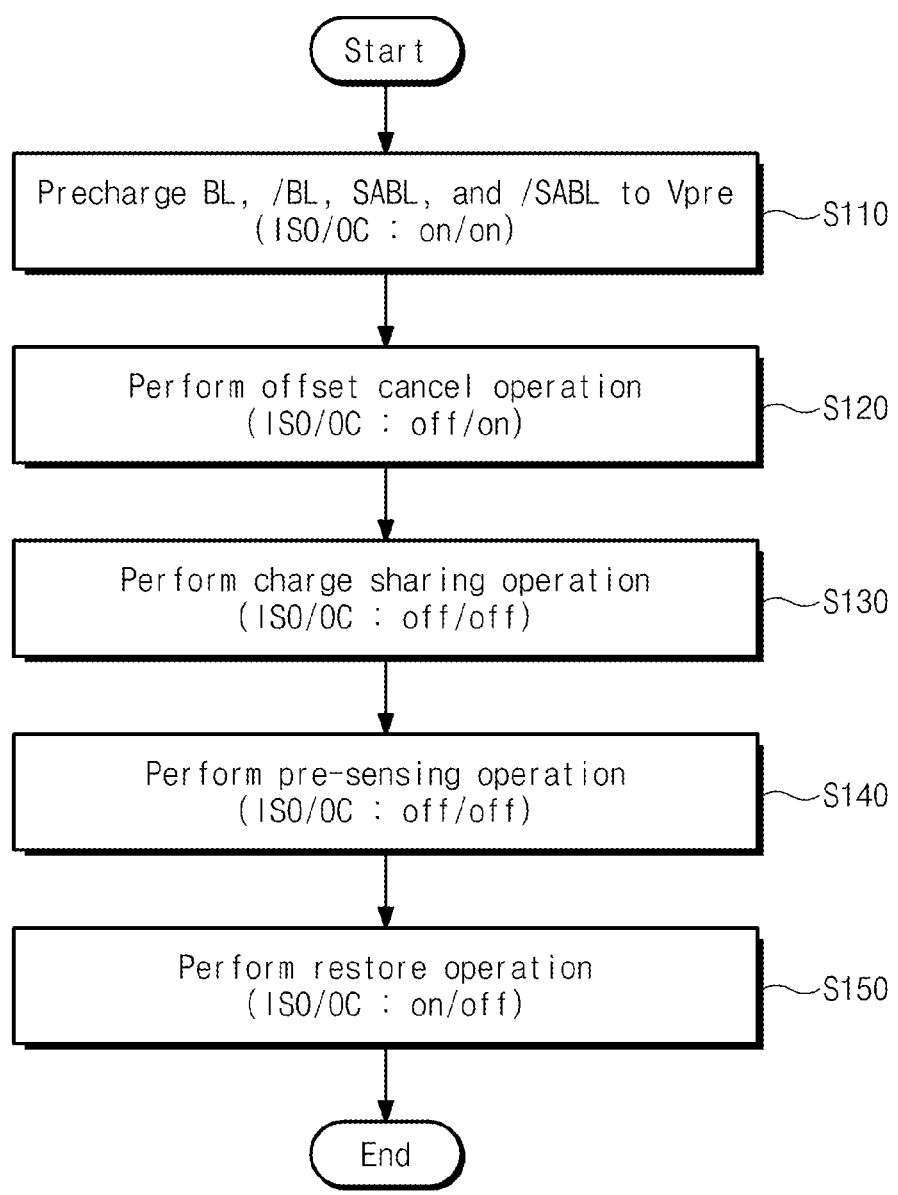
FIG. 7 is a flowchart illustrating an operation of the sense amplifier illustrated in FIG. 6, according to an embodiment of the inventive concept.

FIG. 7 is a flowchart illustrating an operation of the sense amplifier illustrated in FIG. 6. FIGS. 8 to 13 are circuit diagrams for describing an operation of the sense amplifier illustrated in FIG. 7. For convenience, steps of FIG. 7 is described with reference to FIGS. 8 to 13.

Figure 8:
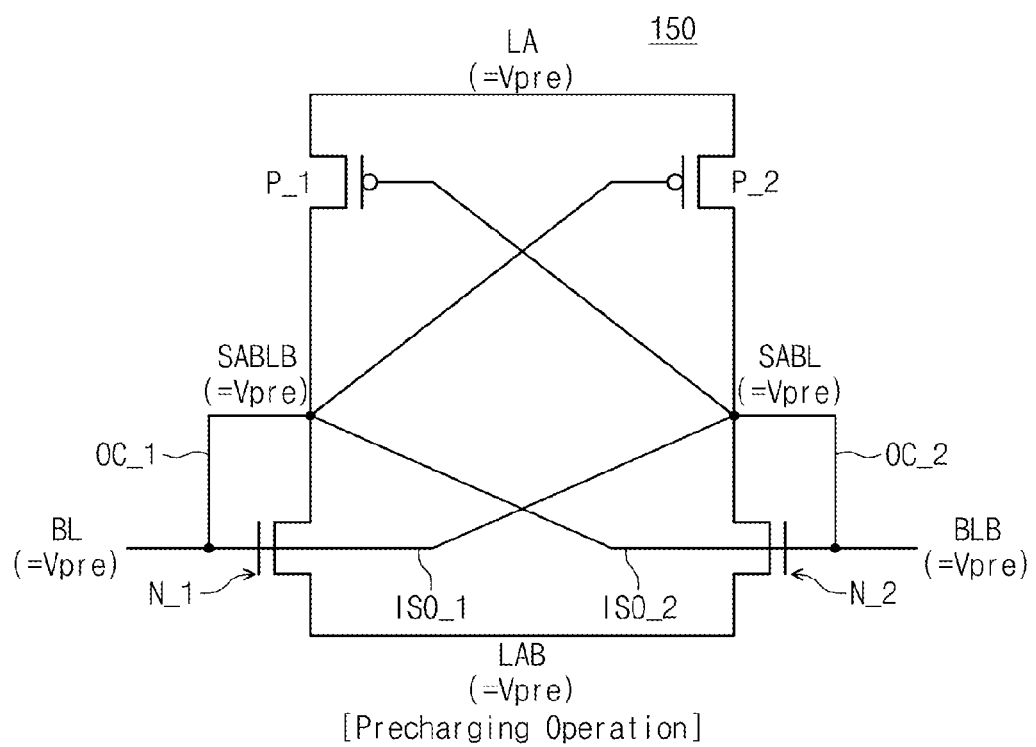
FIG. 8 is a circuit diagram for explaining an operation of the sense amplifier illustrated in FIG. 7, according to an embodiment of the inventive concept.

Referring to FIGS. 7 and 8, in a step S110 of FIG. 7, sense amplifier 150 precharges bitline BL, complementary bitline BLB, sensing bitline SABL and complementary sensing bitline SABLB to a precharge voltage Vpre. Isolation signal ISO and offset cancellation signal OC are high, i.e., they have logic "high" states.

As indicated by the notation in FIG. 7, isolation signal ISO and offset cancellation signal OC are high and first and second isolation switches ISO_1 and ISO_2 and first and second offset cancellation switches OC_1 and OC_2 are turned on. Accordingly, bitline BL, complementary bitline BLB, sensing bitline SABL and complementary sensing bitline SABLB are connected to one node and each line is charged to precharge voltage Vpre. In some embodiments, first and second control signals LA and LAB can be precharged to precharge voltage Vpre.

Sense amplifier 150 further comprises a precharging circuit (not shown). The precharging circuit (not shown) can precharge bitline BL, complementary bitline BLB, sensing bitline SABL and complementary sensing bitline SABLB to the precharge voltage Vpre.

Figure 9:
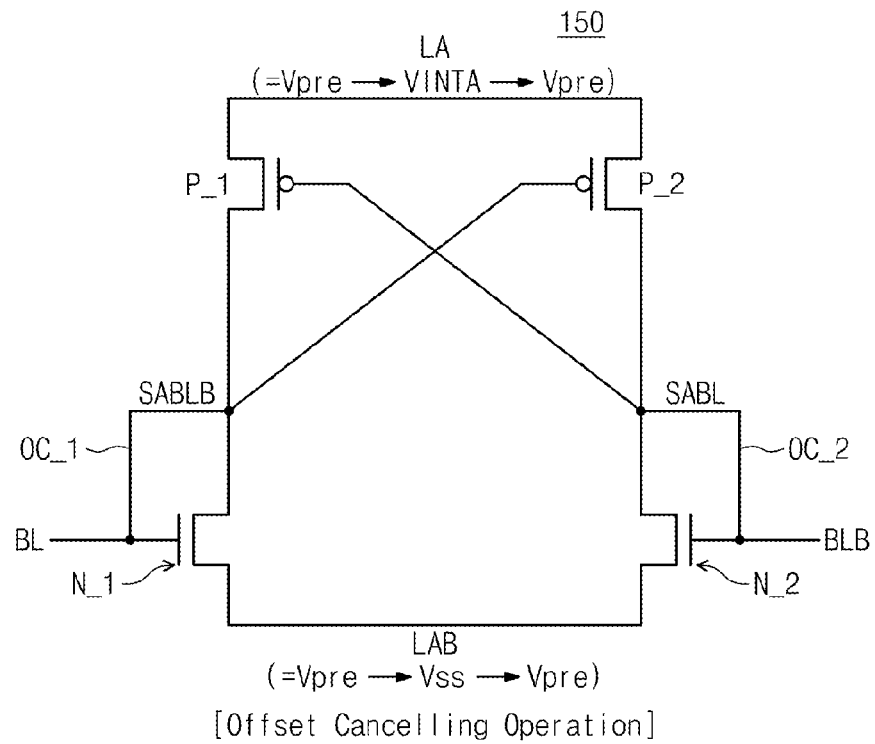
FIG. 9 is a circuit diagram for explaining an operation of the sense amplifier illustrated in FIG. 7, according to an embodiment of the inventive concept.
Figure 10:
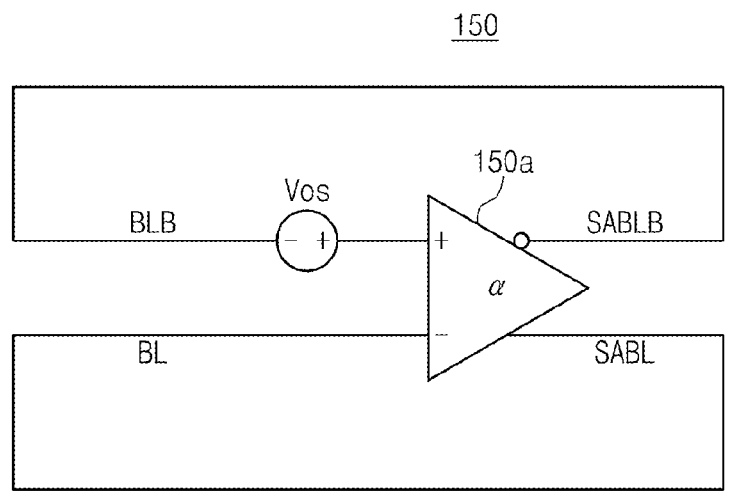
FIG. 10 is a circuit diagram for explaining an operation of the sense amplifier illustrated in FIG. 7, according to an embodiment of the inventive concept.

Referring to FIGS. 7, 9 and 10, in a step S120 of FIG. 7, sense amplifier 150 performs an offset cancelling operation. Isolation signal ISO may be logic low and offset cancellation signal OC may be logic high.

As illustrated in FIG. 9, first and second isolation switches ISO_1 and ISO_2 are turned off and the first and second offset cancellation switches OC_1 and OC_2 are turned on according to isolation signal ISO and offset cancellation signal OC. First control signal LA transits from the precharge voltage Vpre to an input voltage VINTA and second control signal LAB transits from the precharge voltage Vpre to a ground voltage Vss. After that, first control signal LA transits from input voltage VINTA to precharge voltage Vpre and second control signal LAB transits from ground voltage Vss to the precharge voltage Vpre.

According to the circuit configuration in FIG. 6 and first and second control signals LA and LAB described above, offsets of first and second PMOS transistors P_1 and P_2 and first and second NMOS transistors N_1 and N_2 are compensated. For example, as illustrated in FIG. 9, first and second NMOS transistors N_1 and N_2 operate as a diode. Where a threshold voltage of first NMOS transistors N_1 is higher than a threshold voltage of second NMOS transistor N_2, because first control signal LA is input voltage VINTA and second control signal LAB is ground voltage Vss, current flowing through first NMOS transistors N_1 is smaller than a current flowing through second NMOS transistor N_2. A current flowing through the PMOS transistors P_1 is greater than a current through second PMOS transistor P_2. That is, levels of bitline BL and sensing bitline SABL increase by a predetermined value.

FIG. 10 is a diagram illustrating a model of sense amplifier 150 where an offset cancelling operation illustrated in FIG. 9 is performed. In the offset cancelling operation, sense amplifier 150 is modeled as an amplifier 150a and an offset voltage Vos.

A negative output of amplifier 150a is connected to a negative voltage terminal of offset voltage Vos. A positive voltage input terminal of offset voltage Vos is connected to a positive input of amplifier 150a. A positive output of amplifier 150a is connected to a negative input terminal of amplifier 150a. Output terminals of amplifier 150a correspond to sensing bitline SABL and complementary sensing bitline SABLB and input terminals of amplifier 150a correspond to bitline BL and complementary bitline BLB. Offset voltage Vos indicates offsets of first and second PMOS transistors P_1 and P_2 and first and second NMOS transistors N_1 and N_2. An operation of the equivalent circuit illustrated in FIG. 10 can be represented by the following mathematical formula (1).

$$V_{BL} + V_{OS} - V_{BLB} = \alpha(V_{SABL} - V_{SABLB})$$

$$\because (V_{BL} = V_{SABLB}, V_{BLB} = V_{SABL})$$

$$V_{BL} - V_{BLB} = -V_{OS}\left(\frac{1}{1+\alpha}\right) \simeq -V_{OS} \quad (1)$$

Referring to mathematical formula (1), VBL indicates a voltage of bitline BL, Vos indicates an offset value of sense amplifier 150, VBLB indicates a voltage of complementary bitline BLB, VSABL indicates a voltage of sensing bitline SABL, VSABLB indicates a voltage of complementary sensing bitline SABLB and a indicates a voltage gain of amplifier 150a. As indicated by mathematical formula 1, a voltage difference between bitline BL and complementary bitline BLB is close to offset voltage Vos. A voltage level of bitline BL is compensated by offset voltage Vos and thereby an offset of sense amplifier 150 can be compensated.

Referring to the circuit illustrated in FIG. 9, a threshold voltage of first NMOS transistors N_1 is different from a threshold voltage of second NMOS transistor N_2 due to a process variation and a temperature PVT. It is assumed that the threshold voltage of first NMOS transistors N_1 is higher than the threshold voltage of second NMOS transistor N_2 by offset voltage Vos. In this case, a level of bitline BL becomes higher than precharge voltage Vpre by offset voltage Vos according to the operation described with reference to FIG. 9 and the operation of the modeled circuit of FIG. 10. That is, there is a voltage difference of offset voltage Vos between bitline BL and complementary bitline BLB. Voltages of bitline BL and complementary bitline BLB may be reduced by a threshold voltage of the transistors.

Because a voltage being applied to a gate of the first NMOS transistors N_1 and a voltage being applied to a gate of the second NMOS transistor N_2 have a difference of offset voltage Vos, the first and second NMOS transistors N_1 and N_2 have substantially the same current characteristic. That is, because an offset noise of sense amplifier 150 is reduced, even though the voltage variation ΔV (refer to FIG. 3) becomes small, a sufficient effective sensing margin of sense amplifier 150 can be obtained.

Figure 11:
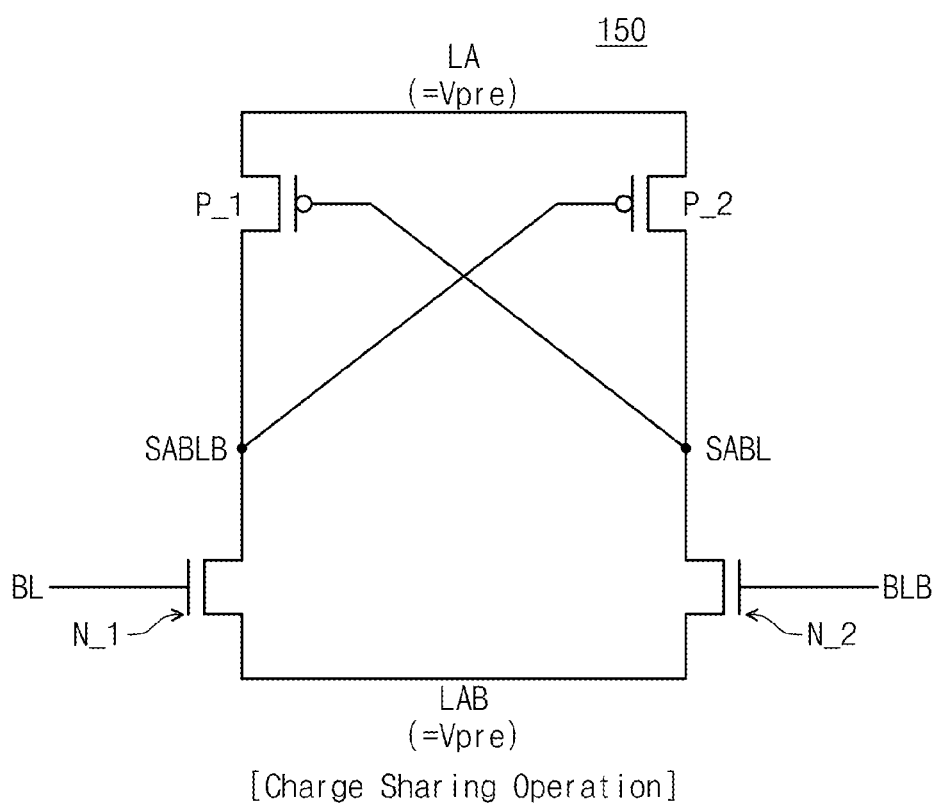
FIG. 11 is a circuit diagram for explaining an operation of the sense amplifier illustrated in FIG. 7, according to an embodiment of the inventive concept.

Referring to FIGS. 7 and 11, in a step S130 of FIG. 7, sense amplifier 150 performs a charge sharing operation. Isolation signal ISO and offset cancellation signal OC may be logic low. For example, isolation signal ISO and offset cancellation signal OC become logic low and thereby first and second isolation switches ISO_1 and ISO_2 and first and second offset cancellation switches OC_1 and OC_2 are turned off and sense amplifier 150 has the circuit configuration illustrated in FIG. 10. A wordline connected to a memory cell MC is activated and a charge sharing occurs between charges stored in a capacitor of memory cell MC and charges stored in a bitline BL. Where data "1" is stored in memory cell MC, where charge sharing occurs, a voltage of bitline BL increase by a predetermined level. Where data "0" is stored in memory cell MC, when a charge sharing occurs, a voltage of bitline BL is reduced by a predetermined level.

Figure 12:
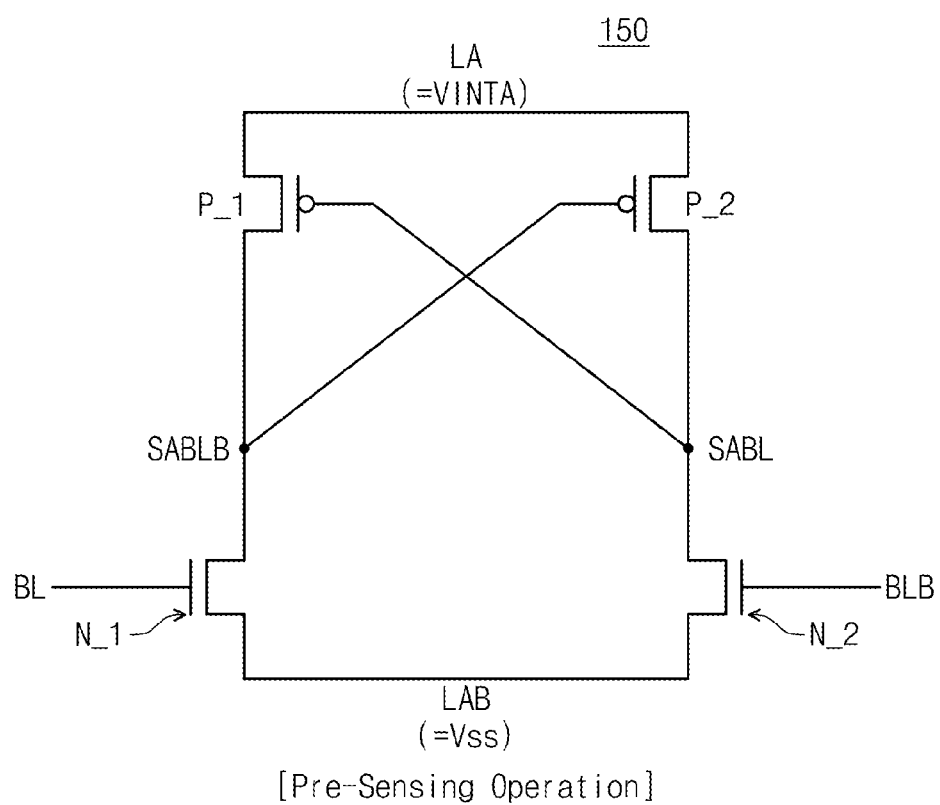
FIG. 12 is a circuit diagram for explaining an operation of the sense amplifier illustrated in FIG. 7, according to an embodiment of the inventive concept.

Referring to FIGS. 7 and 12, in a step S140 of FIG. 7, sense amplifier 150 performs a pre-sensing operation. Isolation signal ISO and offset cancellation signal OC are logic low.

Where the charge sharing operation described with reference to step S130 and FIG. 11 is performed, a voltage of bitline BL may increase or decrease by a predetermined level ΔV depending on data stored in memory cell MC. At this time, first control signal LA transitions to input voltage VINTA and second control signal LAB transitions to ground voltage Vss and thereby sense amplifier 150 may have a circuit configuration illustrated in FIG. 12. Accordingly, sense amplifier 150 can charge voltages of bitline BL and complementary bitline BLB to input voltage VINTA or can discharge voltages of bitline BL and complementary bitline BLB to ground voltage Vss on the basis of a voltage difference between bitline BL and complementary bitline BLB, respectively.

Where data "1" is stored in memory cell MC, while a pre-sensing operation is performed, sensing bitline SABL increases to input voltage VINTA and complementary sensing bitline SABLB is reduced to ground voltage Vss. Where data "0" is stored in memory cell MC, while a pre-sensing operation is performed, sensing bitline SABL is reduced to ground voltage Vss and complementary sensing bitline SABLB increases to input voltage VINTA.

While a pre-sensing operation is performed, bitline pair BL and BLB, and sensing bitline pair SABL and SABLB are cut off by first and second isolation/offset cancellation units 151 and 152. That is, coupling effect between bitlines is reduced and a sensing speed increases by separating sense amplifier 150 from bitline BL and complementary bitline BLB.

Figure 13:
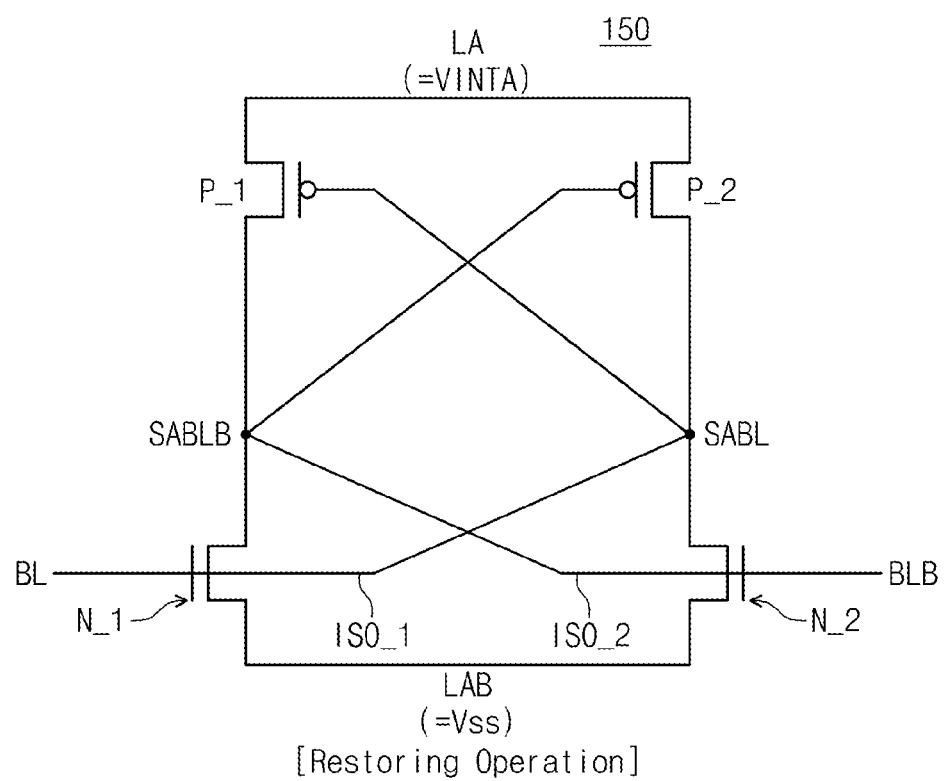
FIG. 13 is a circuit diagram for explaining an operation of the sense amplifier illustrated in FIG. 7, according to an embodiment of the inventive concept.

Referring to FIGS. 7 and 13, in a step S150 of FIG. 7, sense amplifier 150 can perform a restoring operation. Isolation signal ISO is logic high and offset cancellation signal OC is logic low.

Isolation signal ISO becomes logic high and offset cancellation signal OC becomes logic low and thereby first and second isolation switches ISO_1 and ISO_2 are turned on and first and second offset cancellation switches OC_1 and OC_2 are turned off. As illustrated in FIG. 13, bitline BL and sensing bitline SABL are connected to each other by first isolation switch ISO_1, and complementary bitline BLB and complementary sensing bitline SABLB are connected to each other by second isolation switch ISO_2. Bitline BL increases or decreases to a voltage level of sensing bitline SABL which is presensed.

The restoring operation is described with reference to step S150 and FIG. 13. However, the inventive concept is not limited thereto. Sensing bitline SABL and complementary sensing bitline SABLB may be connected to a data line (not shown). After the pre-sensing operation, sensing bitline SABL and complementary sensing bitline SABLB can be connected to the data line and voltages of sensing bitline SABL and complementary sensing bitline SABLB can be transmitted to a local sense amplifier, a global sense amplifier or an input/output circuit via the data line.

According to some embodiments described above, sense amplifier 150 performs a precharging operation, an offset cancelling operation, a charge sharing operation and a restoring operation on the basis of isolation signal ISO, offset cancellation signal OC and first and second control signals LA and LAB. In this case, sense amplifier 150 compensates an offset of sense amplifier 150 through the offset cancelling operation and minimizes coupling between bitlines through the pre-sensing operation, thereby improving an effective sensing margin. Thus, a sense amplifier having improved performance and a memory device comprising the sense amplifier are provided.

Figure 14:
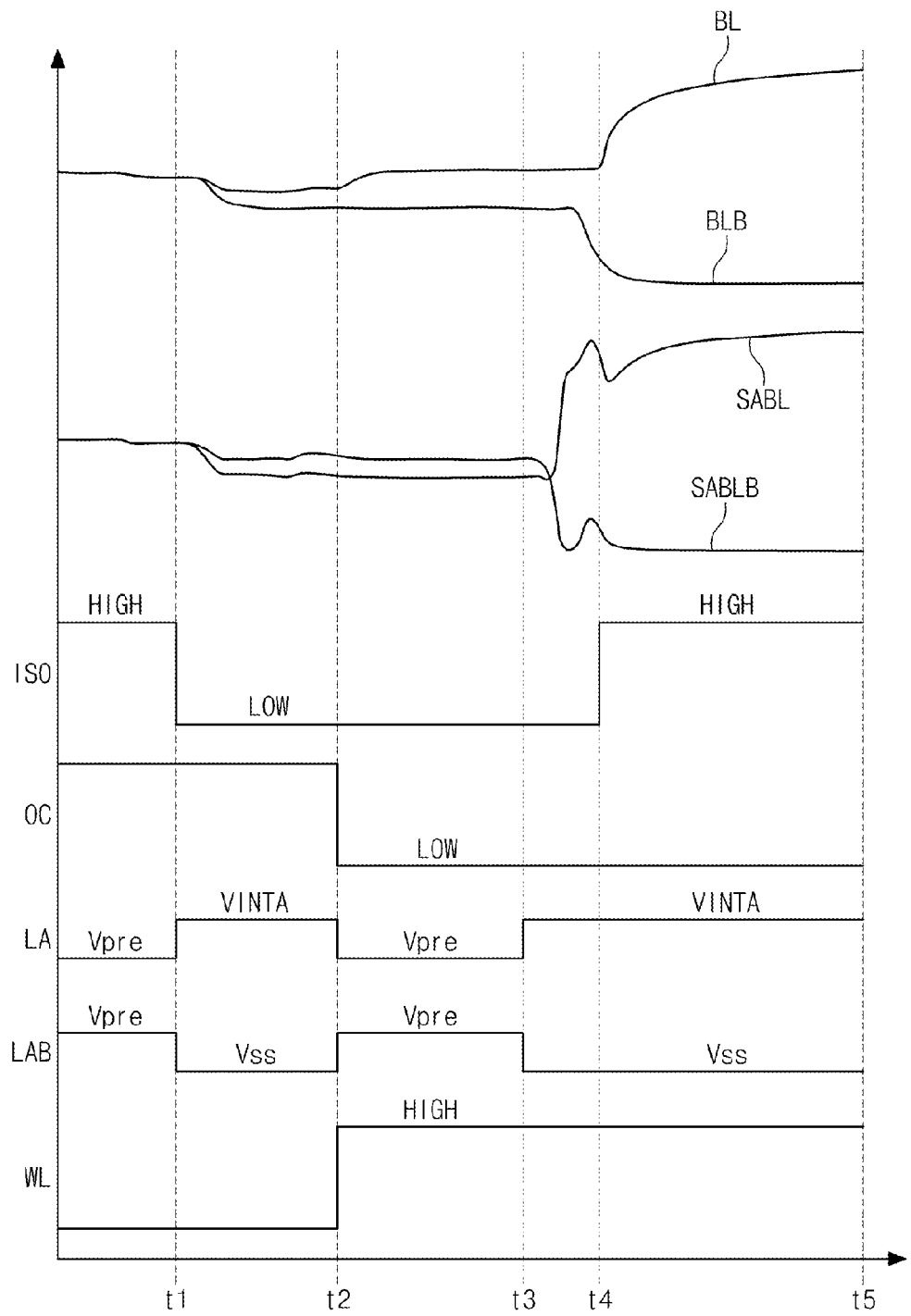
FIG. 14 is a timing diagram for explaining an operation of the sense amplifier illustrated in FIG. 7, according to an embodiment of the inventive concept.

FIG. 14 is a timing diagram for describing an operation of the sense amplifier illustrated in FIG. 7, according to an embodiment of the inventive concept. An X axis indicates time and a Y axis indicates a signal level. It is assumed that memory cell MC stores data "1" and a threshold voltage of the first NMOS transistor N_1 is higher than a threshold voltage of the second NMOS transistor N_2 by an offset voltage Vos. However, the inventive concept is not limited thereto.

Referring to FIG. 14, sense amplifier 150 sequentially performs a pre-charging operation, an offset cancelling operation, a charge sharing operation, pre-sensing operation and a restoring operation.

In a first period (t0~t1), sense amplifier 150 performs the precharging operation. At this time, isolation signal ISO and offset cancellation signal OC are logic high and a pair (BL, BLB) of bitlines and a pair (SABL, SABLB) of sensing bitlines are charged to pre-charge voltage Vpre.

After that, in a second period (t1~t2), sense amplifier 150 performs an offset cancelling operation. At this time, isolation signal ISO becomes logic low. First control signal LA increases from pre-charge voltage Vpre to input voltage VINTA and second control signal LAB is reduced from pre-charge voltage Vpre to ground voltage Vss. Sense amplifier 150 can perform an offset cancelling operation using the method described with reference to FIGS. 7, 9 and 10. While the offset cancelling operation is performed, bitline BL becomes higher than complementary bitline BLB by offset voltage Vos. Voltages of the pair (BL, BLB) of bitlines may be reduced by a threshold voltage of transistors of sense amplifier 153.

In a third period (t2~t3), sense amplifier 150 performs the charge sharing operation. At this time, isolation signal ISO and offset cancellation signal OC become logic low and wordline WL is activated and thereby a charge sharing occurs between charges of bitline BL and charges stored in memory cell MC. For example, where data "1" is stored in memory cell MC (i.e., a voltage of a capacitor of memory cell MC is higher than a reference value), a bitline voltage VBL increases by a voltage variation ΔV. Although not illustrated in the drawing, where data "0" is stored in memory cell MC (a voltage of a capacitor of memory cell MC is lower than a reference value), the bitline voltage VBL may be reduced by the voltage variation ΔV.

In a fourth period (t3~t4), sense amplifier 150 can perform the pre-sensing operation. At this time, first control signal LA transitions to input voltage VINTA and second control signal LAB transitions to ground voltage Vss. Accordingly, a level of sensing bitline SABL increases to input voltage VINTA and a level of complementary sensing bitline SABLB is reduced to ground voltage Vss. Although not illustrated in the drawing, a level of sensing bitline SABL may be reduced to ground voltage Vss and a level of complementary sensing bitline SABLB may increase to input voltage VINTA according to voltages of bitline BL and complementary bitline BLB.

In a fifth period (t4~t5), sense amplifier 150 performs the restoring operation. At this time, isolation signal ISO becomes logic high and thereby first and second isolation switches ISO_1 and ISO_2 are turned on. The pair (BL, BLB) of bitlines and the pair (SABL, SABLB) of sensing bitlines are connected to each other. The pair (BL, BLB) of bitlines is charged or discharged to a level of the pair (SABL, SABLB) of sensing bitlines.

Figure 15:
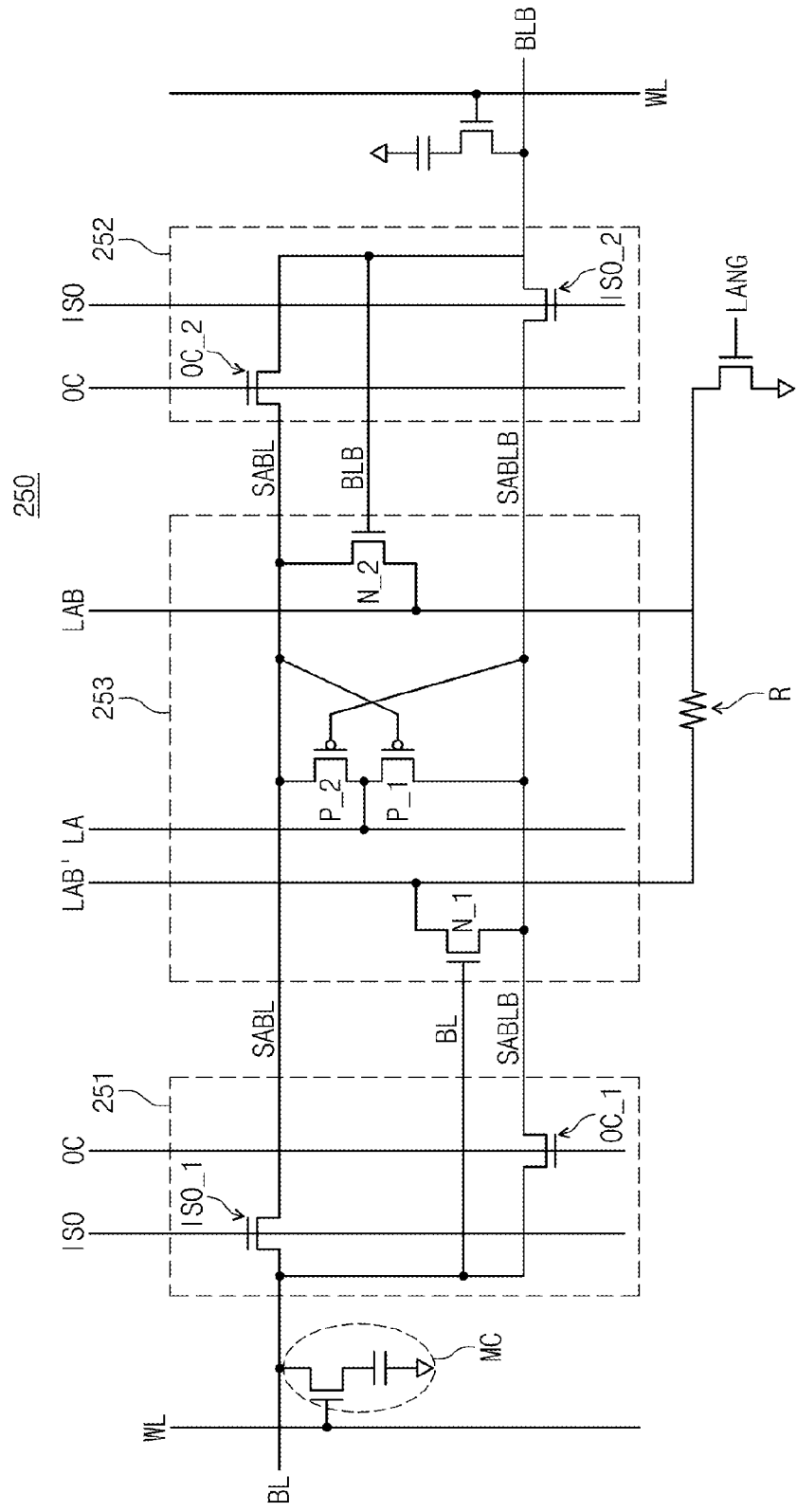
FIG. 15 is a circuit diagram illustrating a sense amplifier according to an embodiment of the inventive concept.
Figure 16:
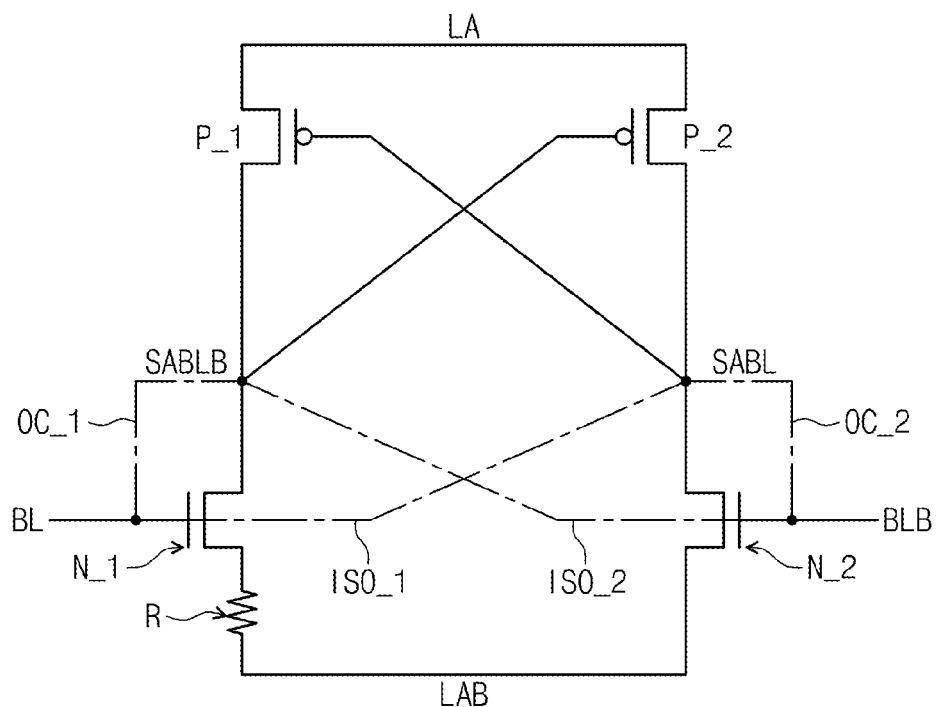
FIG. 16 is an equivalent circuit of the sense amplifier illustrated in FIG. 15, according to an embodiment of the inventive concept.

FIG. 15 is a circuit diagram illustrating a sense amplifier 250 according to an embodiment of the inventive concept. FIG. 16 is an equivalent circuit of sense amplifier 250 illustrated in FIG. 15, according to an embodiment of the inventive concept.

Referring to FIGS. 15 and 16, sense amplifier 250 comprises first and second isolation/offset cancellation units 251 and 252 and a sense amplifying unit 253. First isolation/offset cancellation unit 251 comprises a first isolation switch ISO_1 and a first offset cancellation switch OC_1. Second isolation/offset cancellation units 252 comprise a second isolation switch ISO_2 and a second offset cancellation switch OC_2. Sense amplifying unit 253 comprises first and second PMOS transistors P_1 and P_2 and first and second NMOS transistors N_1 and N_2. Because operations of first and second isolation/offset cancellation units 251 and 252 and sense amplifying unit 253 were described with reference to FIGS. 4 through 13, a further description thereof is omitted here to avoid redundancy.

Unlike first NMOS transistor N_1 of sense amplifier 150 of FIG. 5, first NMOS transistor N_1 of sense amplifier 250 of FIG. 15 operates based on a third control signal LAB'. For example, one end of first NMOS transistor N_1 of sense amplifier 250 is connected to a complementary sensing bitline SABLB and the other end of first NMOS transistor N_1 of sense amplifier 250 is connected to third control signal LAB'. Third control signal LAB' may be the same as second control signal LAB. But as illustrated in FIG. 16, a signal noise may occur due to interconnection resistance R connecting second control signal LAB and third control signal LAB'.

In this case, a signal noise due to the interconnection resistance may be in an offset voltage Vos. Sense amplifier 250 can perform an offset cancelling operation on the basis of the method described with reference to FIGS. 7, 9 and 10. The offset cancelling operation represents an operation compensating a characteristic difference of elements in the sense amplifier due to a process variation and a temperature. In some embodiments, the offset may comprise signal noise due to interconnection resistance R of the sense amplifier. The signal noise due to the interconnection resistance R can be compensated together with the characteristic difference of elements when the offset cancelling operation is performed.

As illustrated in FIG. 15, a layout of sense amplifier 250 can be simplified by separately disposing the first and second NMOS transistors N_1 and N_2.

In certain other embodiments of the inventive concept, sense amplifier 250 can perform an offset cancelling operation, a charge sharing operation, a pre-sensing operation and a restoring operation. Sense amplifier 250 can compensate an offset of sense amplifier 250 through the offset cancelling operation and can reduce coupling effect between bitlines through the pre-sensing operation. A simplified layout is provided by separately disposing elements in sense amplifier 250. Thus, a sense amplifier having improved performance and reduce cost and a memory device comprising the sense amplifier are provided.

Figure 17:
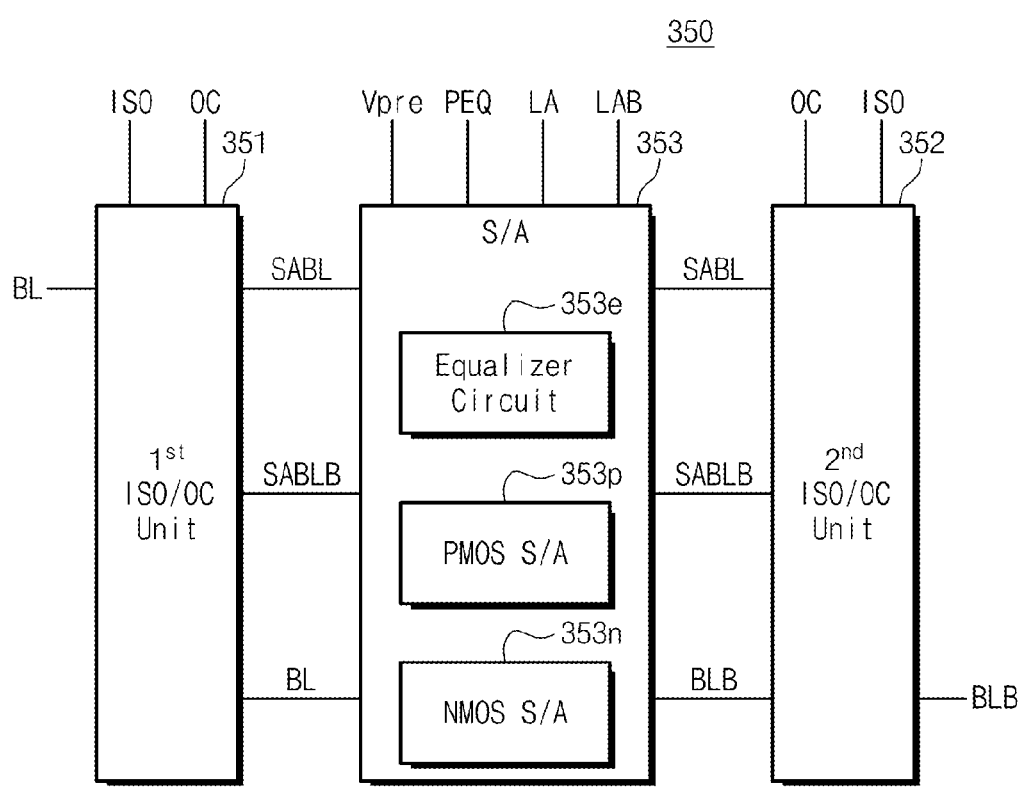
FIG. 17 is a block diagram illustrating a sense amplifier according to an embodiment of the inventive concept.

FIG. 17 is a block diagram illustrating a sense amplifier 350 according to an embodiment of the inventive concept.

Referring to FIG. 17, sense amplifier 350 comprises first and second isolation/offset cancellation units 351 and 352 and a sense amplifying unit 353. Sense amplifying unit 353 comprises a PMOS sense amplifying unit 353p, an NMOS sense amplifying unit 353n, and an equalizing circuit 353e. Compared with sense amplifier 150 of FIG. 4, sense amplifier 350 of FIG. 17 further comprises equalizing circuit 353e. Differences between sense amplifier 350 of FIG. 17 and sense amplifier 150 of FIG. 4 are explained below.

Equalizing circuit 353e equalizes a pair (BL, BLB) of bitlines and a pair (SABL, SABLB) of sensing bitlines to a precharge voltage Vpre. For example, where a precharging operation of sense amplifier 350 is performed, an isolation signal ISO and an offset cancellation signal OC become logic high, and the pair (BL, BLB) of bitlines and the pair (SABL, SABLB) of sensing bitlines can be connected to one node. In this case, equalizing circuit 353e can charge or equalize the pair (BL, BLB) of bitlines and the pair (SABL, SABLB) of sensing bitlines to pre-charge voltage Vpre in response to an equalizing signal PEQ.

Where the charge sharing operation of sense amplifier 350 is performed, isolation signal ISO and offset cancellation signal OC become logic low and thereby the pair (BL, BLB) of bitlines and the pair (SABL, SABLB) of sensing bitlines are separated from each other. Equalizing circuit 353e can charge the pair (SABL, SABLB) of sensing bitlines to pre-charge voltage Vpre in response to equalizing signal PEQ. Unlike sense amplifier 150 of FIG. 5, sense amplifier 350 of FIG. 17, when the charge sharing operation is performed, charges the pair (SABL, SABLB) of sensing bitlines to pre-charge voltage Vpre.

Figure 18:
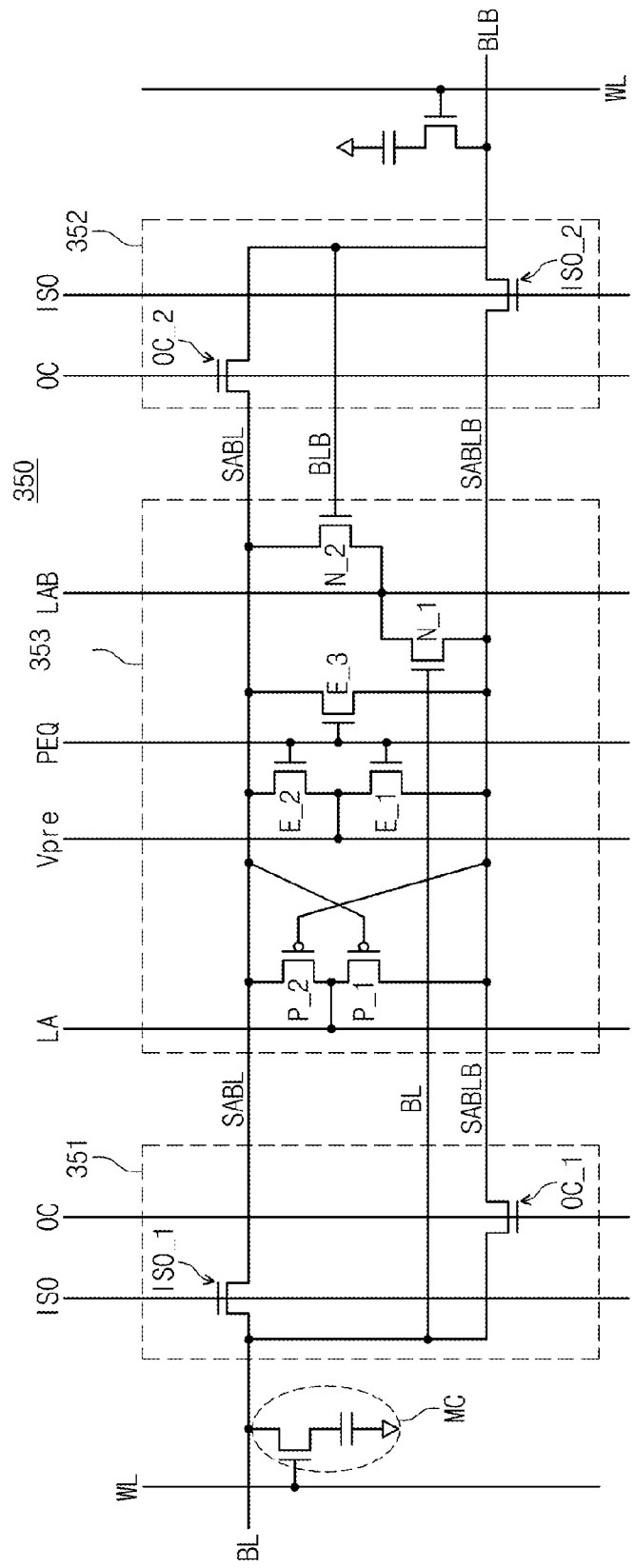
FIG. 18 is a circuit diagram illustrating the sense amplifier illustrated in FIG. 17, according to an embodiment of the inventive concept.
Figure 19:
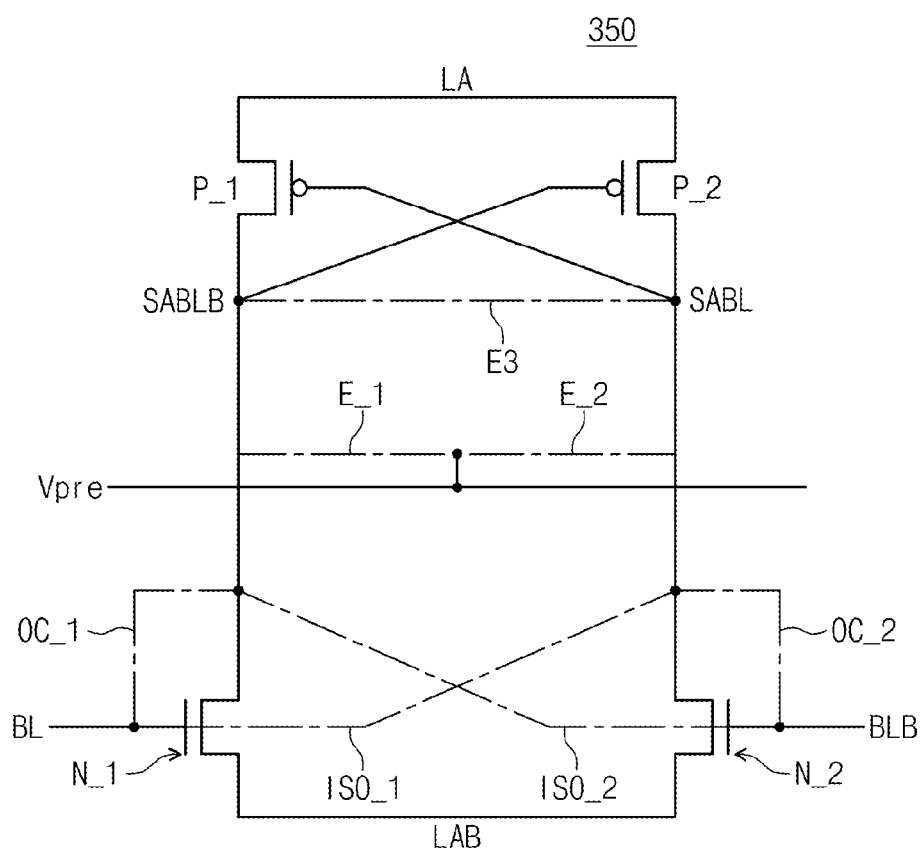
FIG. 19 is an equivalent circuit of the sense amplifier illustrated in FIG. 18, according to an embodiment of the inventive concept.

FIG. 18 is a circuit diagram illustrating the sense amplifier illustrated in FIG. 17, according to an embodiment of the inventive concept. FIG. 19 is an equivalent circuit of the sense amplifier illustrated in FIG. 18, according to an embodiment of the inventive concept. For explanation purposes, multiple switches ISO_1, ISO_2, OC_1, OC_2, E_1, E_2 and E_3 are illustrated by broken lines in FIG. 19.

Referring to FIGS. 18 and 19, sense amplifier 350 comprises first and second isolation/offset cancellation units 351 and 352 and sense amplifying unit 353. First isolation/offset cancellation unit 351 comprises a first isolation switch ISO_1 and a first offset cancellation switch OC_1. Second isolation/offset cancellation unit 352 comprises a second isolation switch ISO_2 and a second offset cancellation switch OC_2. Sense amplifying unit 353 comprises first and second PMOS transistors P_1 and P_2, first and second NMOS transistors N_1 and N_2 and first through third equalizing switches E_1, E_2 and E_3. Because first and second isolation switches ISO_1 and ISO_2, first and second offset cancellation switches OC_1 and OC_2, first and second PMOS transistors P_1 and P_2 and first and second NMOS transistors N_1 and N_2 of FIG. 17 were described with reference to FIG. 6, additional description of these features is omitted in order to avoid redundancy.

First through third equalizing switches E_1, E_2 and E_3 can constitute equalizing circuit 353e. First and second equalizing switches E_1 and E_2 are serially connected to each other between the pair (SABL, SABLB) of sensing bitlines. Third equalizing switch E_3 is connected between the pair (SABL, SABLB) of sensing bitlines. First through third equalizing switches E_1, E_2 and E_3 operate in response to equalizing signal PEQ. As illustrated in FIG. 19, where equalizing signal PEQ is logic high, first through third equalizing switches E_1, E_2 and E_3 are turned on. The pair (SABL, SABLB) of sensing bitlines is charged to pre-charge voltage Vpre by first and second equalizing switches E_1 and E_2. The pair (SABL, SABLB) of sensing bitlines is equalized by the third equalizing switch E_3.

Where sense amplifier 350 performs the precharging operation and the charge sharing operation, equalizing signal PEQ may become logic high. That is, where sense amplifier 350 performs the precharging operation, equalizing circuit 353e can charge or equalize the pair (BL, BLB) of bitlines and the pair (SABL, SABLB) of sensing bitlines to pre-charge voltage Vpre in response to an equalizing signal PEQ. Where sense amplifier 350 performs the charge sharing operation, equalizing circuit 353e can charge or equalize the pair (SABL, SABLB) of sensing bitlines to the precharge voltage Vpre in response to an equalizing signal PEQ.

Figure 20:
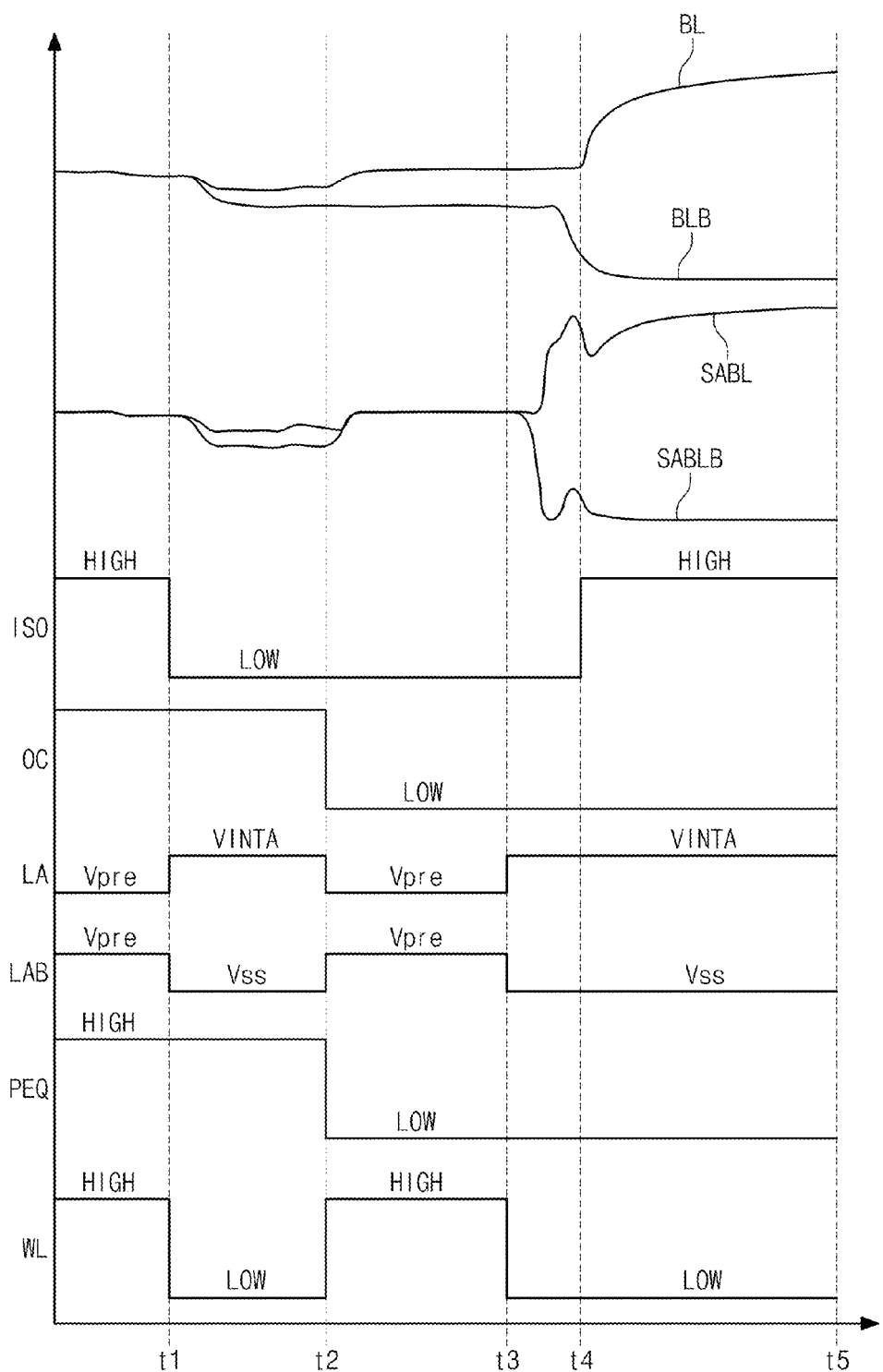
FIG. 20 is a timing diagram for explaining an operation of the sense amplifier illustrated in FIG. 19, according to an embodiment of the inventive concept.

FIG. 20 is a timing diagram for explaining an operation of the sense amplifier illustrated in FIG. 19, according to an embodiment of the inventive concept. In the diagram of FIG. 20, the X axis indicates time and the Y axis indicates a signal level. Operations of second, fourth and fifth periods (t1~t2, t3~t4, t4~t5) in FIG. 20 were described with reference to FIG. 14, so a detailed description thereof is omitted.

Sense amplifier 350 performs the precharging operation during a first section (t0~t1) illustrated in FIG. 20. Isolation signal ISO and offset cancellation signal OC become logic high and the pair (BL, BLB) of bitlines and the pair (SABL, SABLB) of sensing bitlines are connected to one node. Equalizing signal PEQ is activated and equalizing circuit 353e can charge or equalize the pair (BL, BLB) of bitlines and the pair (SABL, SABLB) of sensing bitlines to the precharge voltage Vpre in response to equalizing signal PEQ.

Sense amplifier 350 performs the charge sharing operation during a third section (t2~t3) illustrated in FIG. 20. At this time, equalizing signal PEQ is activated. Accordingly, the pair (SABL, SABLB) of sensing bitlines is charged to the precharge voltage Vpre.

Figure 21:
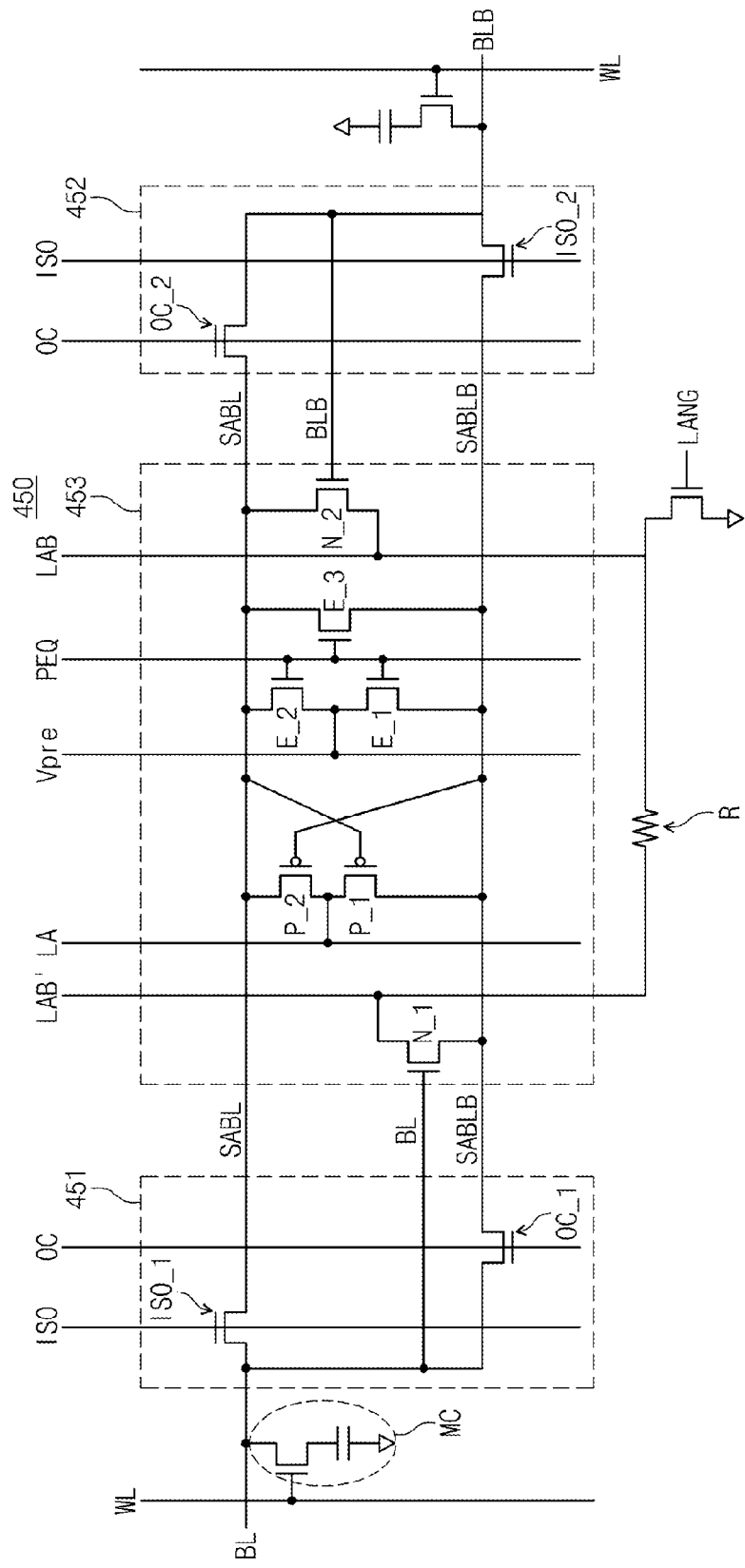
FIG. 21 is a circuit diagram illustrating a sense amplifier, according to an embodiment of the inventive concept.

FIG. 21 is a circuit diagram illustrating a sense amplifier 450 according to an embodiment of the inventive concept.

Referring to FIG. 21, sense amplifier 450 comprises first and second isolation/offset cancellation units 451 and 452 and a sense amplifying unit 453. First isolation/offset cancellation unit 451 comprises a first isolation switch ISO_1 and a first offset cancellation switch OC_1. Second isolation/offset cancellation unit 452 comprises a second isolation switch ISO_2 and a second offset cancellation switch OC_2. Sense amplifying unit 453 comprises first and second PMOS transistors P_1 and P_2, first and second NMOS transistors N_1 and N_2 and first through third equalizing switches E_1, E_2 and E_3. Because the constituent elements of FIG. 21 were described with reference to FIG. 19, a detailed description thereof is omitted. A difference between sense amplifier 450 of FIG. 21 and sense amplifier 350 of FIG. 19.

In contrast to FIG. 19, one end of the first NMOS transistor N_1 in FIG. 21 receives a third control signal LAB'. Third control signal LAB' is the same as second control signal LAB. Third control signal LAB' may have signal noise due to an interconnection resistance R. As described with reference to FIGS. 15 and 16, sense amplifier 450 can compensate the signal noise due to the interconnection resistance R through an offset cancelling operation. A layout of sense amplifier 450 can be simplified by separately disposing the first and second NMOS transistors N_1 and N_2.

Sense amplifier 450 compensates for an offset of sense amplifier 450 based on the offset cancelling operation and can reduce coupling between bitlines on the basis of the pre-sensing operation. Thus, a sense amplifier having improved performance and a memory device to which the sense amplifier is applied are provided.

Figure 22:
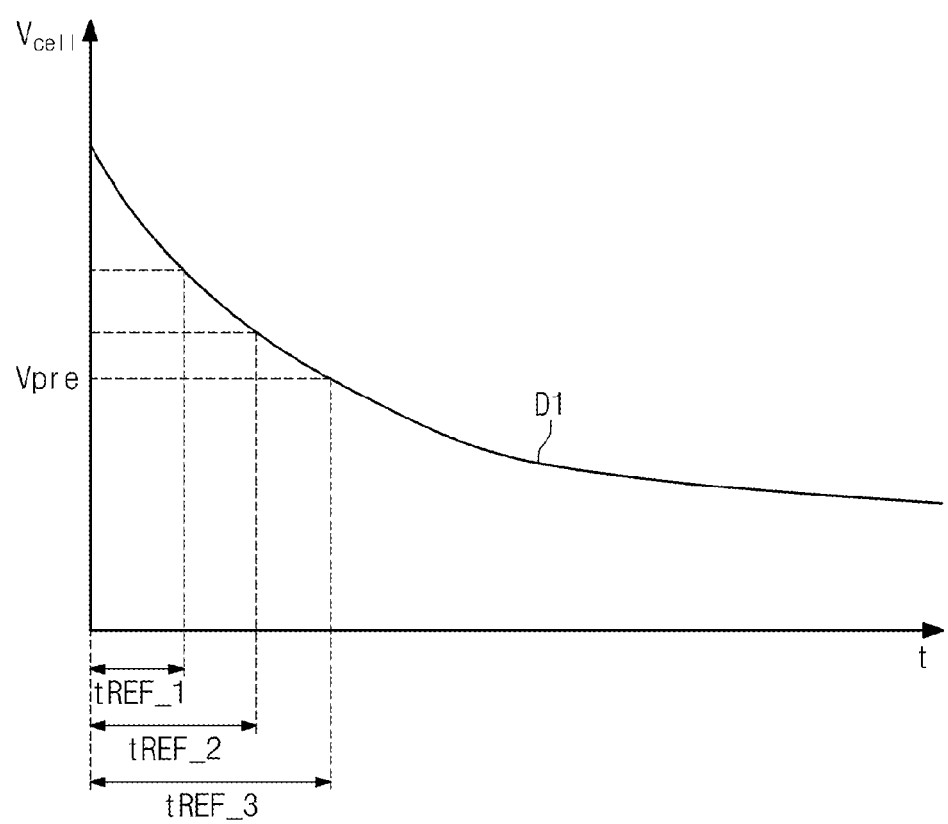
FIG. 22 is a graph for explaining an effect of a sense amplifier according to an embodiment of the inventive concept.

FIG. 22 is a graph illustrating an effect of a sense amplifier according to an embodiment of the inventive concept. In the graph of FIG. 22, the X axis indicates time and the Y axis indicates a cell voltage of a memory cell.

Referring to FIG. 22, a cell voltage charged in the memory cell decreases with the passage of time as illustrated in FIG. 22. Where the cell voltage is below a reference value, the memory device performs a refresh operation.

A refresh period of a memory device comprising a conventional sense amplifier is illustrated as a first period (tREF_1). A refresh period of a memory device comprising a sense amplifier performing an offset cancelling operation is illustrated as a second period (tREF_2). A refresh period of a memory device comprising a sense amplifier according to an embodiment of the inventive concept is illustrated as a third period (tREF_3).

The sense amplifier according to an embodiment of the inventive concept can compensate an offset of the sense amplifier through the offset cancelling operation and can reduce a coupling effect between bitlines through the pre-sensing operation. Accordingly, it increases an effective sensing margin, and therefore even where the cell voltage is below the reference value, the sense amplifier can read out data stored in the memory cell. Thus, because a refresh period of a memory device increases and thereby a refresh current IDDR5 of the memory device is reduced, a sense amplifier having reduced cost and a memory device to which the sense amplifier is applied are provided.

Figure 23:
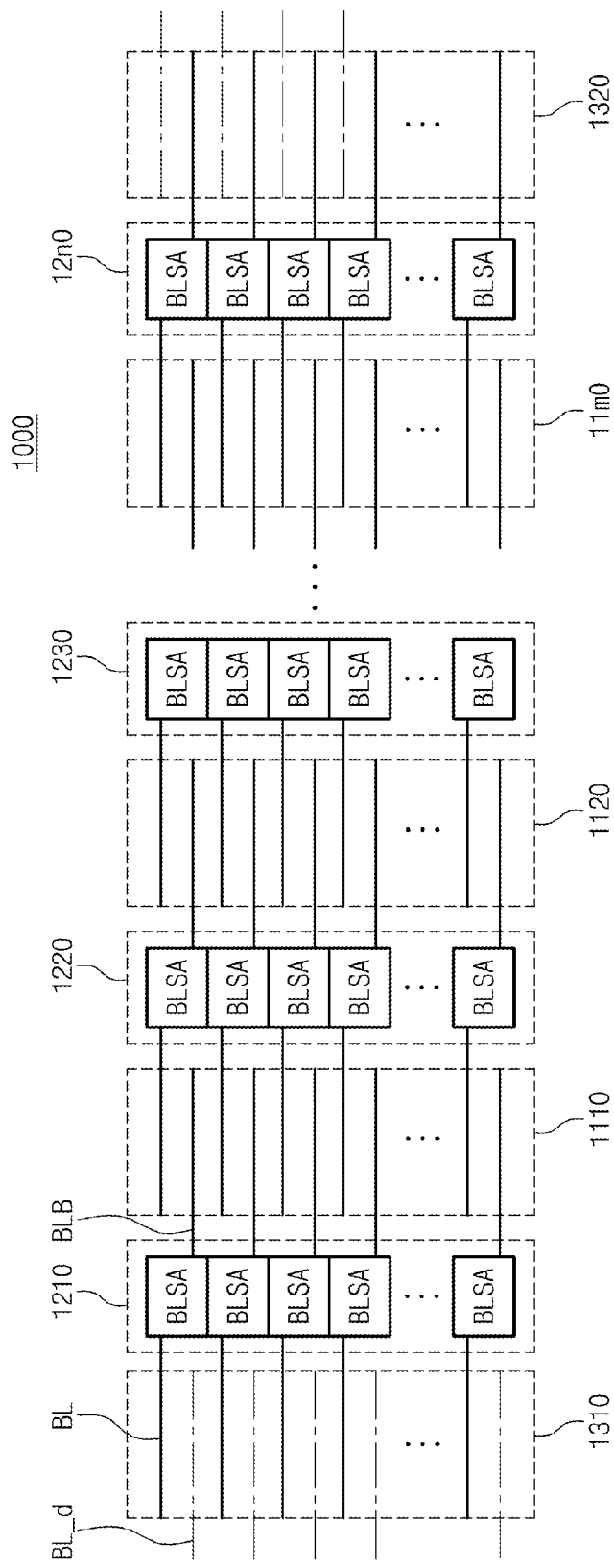
FIG. 23 is a block diagram illustrating a memory device comprising a sense amplifier, according to an embodiment of the inventive concept.

FIG. 23 is a block diagram illustrating a memory device 1000 comprising a sense amplifier, according to an embodiment of the inventive concept.

Referring to FIG. 23, memory device 1000 comprises multiple memory cell arrays 1110~11m0, multiple sense amplifiers 1210~12n0 and dummy arrays 1310 and 1320. Each of sense amplifiers 1210~12n0 comprises multiple bitline sense amplifying units. Multiple pairs (BL, BLB) of bitlines connected to memory cell arrays 1110~11m0 are connected to the bitline sense amplifying units. Memory device 1000 has an open bitline structure. In memory device 1000 having an open bitline structure, where capacitances of the pair (BL, BLB) of the bitlines are different from one another, a pre-charge signal noise may occur. To maintain substantially equal the capacitances of the pair (BL, BLB) of the bitlines, a pair of the bitlines crosses each other to be connected to the bitline sense amplifier.

Dummy arrays 1310 and 1320 may be disposed at an edge of memory device 1000. A part of bitlines of dummy arrays 1310 and 1320 is a complementary bitline and is connected to adjacent bitline sense amplifiers. The remaining bitlines of dummy arrays 1310 and 1320 are not connected to bitline amplifiers as dummy bitlines BL_d. That is, because of the dummy bitlines BL_d disposed at an edge of memory device 100, an overhead of an area of memory device 100 may occur.

Figure 24:
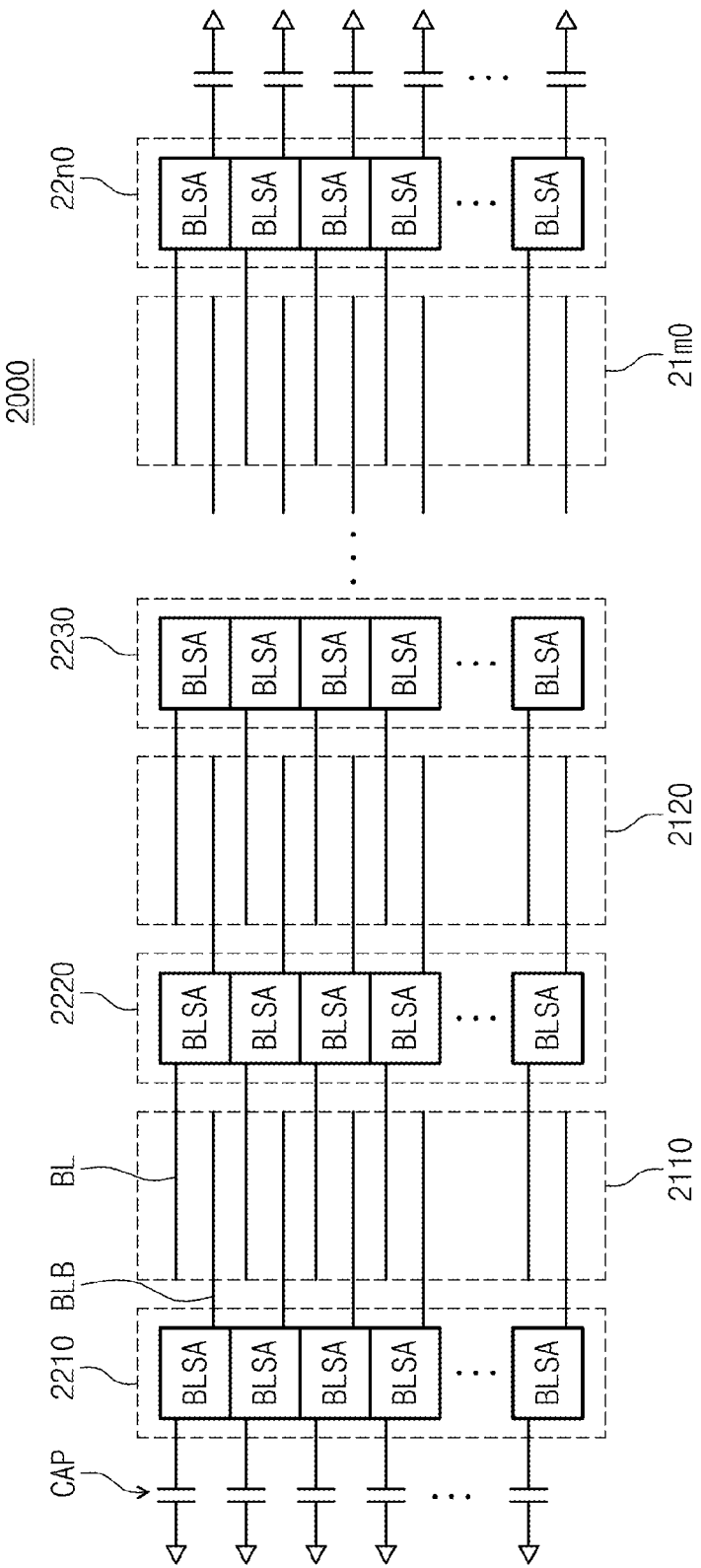
FIG. 24 is a block diagram illustrating a memory device comprising a sense amplifier, according to an embodiment of the inventive concept.

FIG. 24 is a block diagram illustrating a memory device 2000 comprising a sense amplifier, according to an embodiment of the inventive concept.

Referring to FIG. 24, memory device 2000 comprises multiple memory cell arrays 2110~21m0, multiple sense amplifiers 2210~22n0, and multiple capacitors CAPs. Sense amplifiers 2210~22n0 comprise multiple bitline sense amplifiers and the bitline sense amplifiers may comprise sense amplifiers as described with reference to FIGS. 1 through 22.

Unlike memory device 1000 of FIG. 23, memory device 2000 comprises multiple capacitors CAPs. Capacitors CAPs are disposed at the edge of memory device 2000. That is, memory device 2000 does not comprise a dummy array. As described with reference to FIG. 23, for memory device 2000 having an open bitline structure, a pair (BL, BLB) of bitlines crosses each other to be connected to a bitline sense amplifier to maintain substantially equal capacitance of the pair (BL, BLB) of bitlines.

Based on the method described with reference to FIGS. 1 through 22, the described sense amplifier can compensate a difference due to a capacitance imbalance of the pair (BL, BLB) of bitlines through an offset cancelling operation. Capacitors CAPs instead of dummy arrays 1310 and 1320 illustrated in FIG. 23 can be disposed at the edge of memory device 2000. Lines connected to capacitors CAPs are complementary bitlines BLB and can be connected to adjacent bitline sense amplifiers BLSA. The adjacent bitline sense amplifiers BLSA can compensate a difference due to a capacitance imbalance of the pair (BL, BLB) of bitlines on the basis of an offset cancelling operation.

As described above, where the sense amplifier of the inventive concept is applied to the memory device having an open bitline structure, because a capacitance imbalance of the pair (BL, BLB) of bitlines is compensated, the memory device having no dummy array is provided. Thus, a sense amplifier having an improved area and a reduced cost and a memory device having the sense amplifier are provided.

Figure 25:
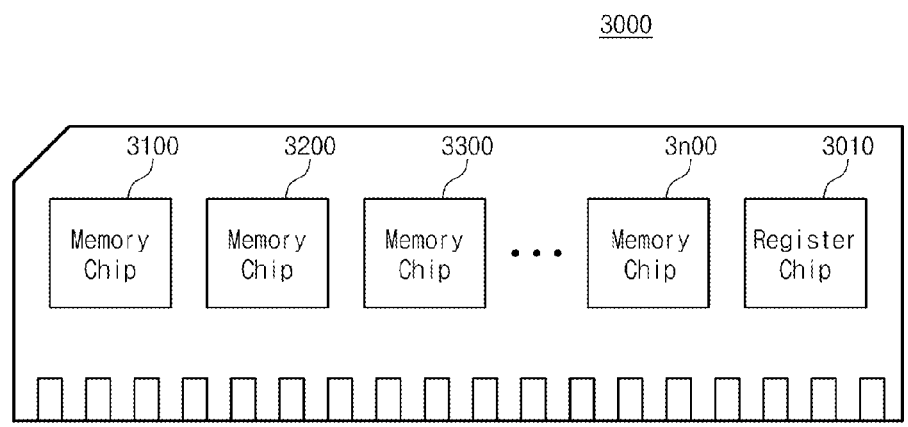
FIG. 25 is a diagram of a memory module comprising a memory device, according to an embodiment of the inventive concept.

FIG. 25 is a drawing illustrating a memory module 3000 comprising a memory device, according to an embodiment of the inventive concept.

Referring to FIG. 25, memory module 3000 comprises multiple memory chips 3100~3n00 and a register chip 3010. Memory chips 3100~3n00 may comprise memory device 100 of FIG. 1.

Memory chips 3100~3n00 receive a command, an address, data, etc. from an external device (for example, a host, a memory controller, AP, etc.), and they perform a read/write operation of data. Register chip 3010 can receive a command, a control signal, etc. from an external device and can store mode register MRS information on the basis of the received command, control signal, etc.

Memory chips 3100~3n00 each comprise sense amplifiers as described with reference to FIGS. 4 through 22. Each of memory chips 3100~3n00 may be memory device 2000 illustrated in FIG. 24.

Figure 26:
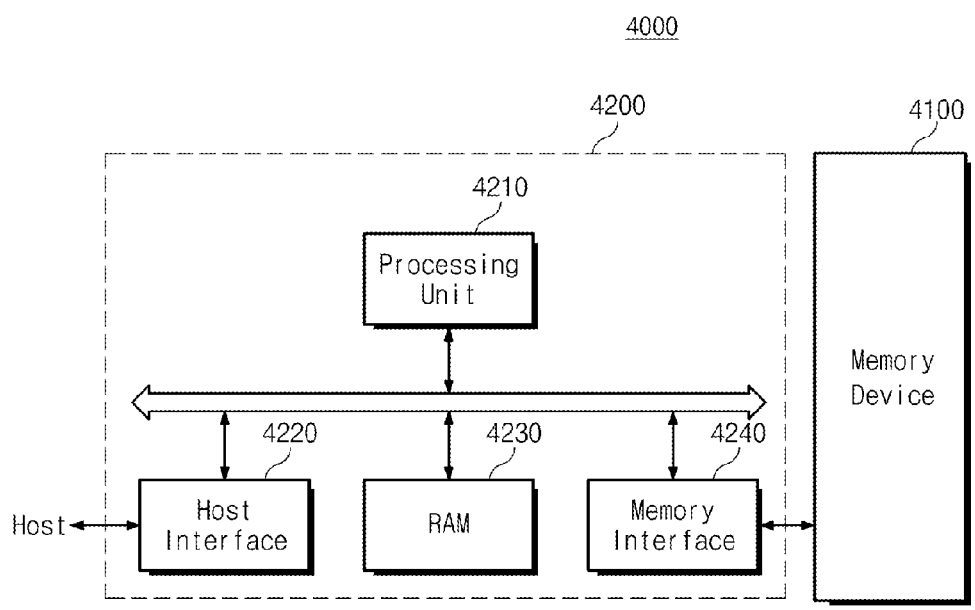
FIG. 26 is a block diagram illustrating a memory system comprising a memory device, according to an embodiment of the inventive concept.

FIG. 26 is a block diagram illustrating a memory system 4000 comprising a memory device, according to an embodiment of the inventive concept.

Referring to FIG. 26, memory system 4000 comprises a memory device 4100 and a memory controller 4200.

Memory controller 4200 is connected to a host and memory device 4100. Memory controller 4200 transmits data read from memory device 4100 to the host and stores data being transmitted from the host in memory device 4100.

Memory controller 4200 comprises constituent elements well known such as a processing unit 4210, a host interface 4220, a RAM 4230 and a memory interface 4240. Processing unit 4210 controls an overall operation of memory controller 4200. Host interface 4220 comprises a protocol for performing a data exchange between the host and memory controller 4200. Memory controller 4200 is configured to communicate with an external device (e.g., the host) through one of various interface protocols such as USB, MMC, PCI-E, ATA (Advanced Technology Attachment), serial-ATA, parallel-ATA, SCSI, ESDI, IDE (Integrated Drive Electronics), eMMC (embedded Multi Media Card), UFS (Universal Flash Storage), etc. RAM 4230 is used as an operation memory of processing unit 4210. RAM 4230 may comprise the sense amplifier and the memory device described with reference to FIGS. 1 through 24. RAM 4230 can operate based on the operation method described with reference to FIGS. 1 through 24.

Memory interface 4240 interfaces with memory device 4100. Memory controller 4200 may additionally comprise an error correction block. The error correction block detects and corrects an error of data read from memory device 4100.

Memory controller 4200 and memory device 4100 can be integrated in one semiconductor chip. Memory controller 4200 and memory device 4100 can be integrated in one semiconductor chip to constitute a memory card. For example, memory controller 4200 and memory device 4100 can be integrated in one semiconductor chip to constitute a PC card (PCMCIA), a compact flash card (CF), a smart media card (SM/SMC), a memory stick, a multimedia card (MMC, RS-MMC, MMCmicro), a SD card (SD, miniSD, microSD), a universal flash memory device (UFS).

Memory controller 4200 and memory device 4100 can be integrated in one semiconductor chip to form a solid state disk/drive (SSD). Where memory system 4000 is used as a solid state disk/drive (SSD), an operation speed of the host connected to memory system 4000 may be improved significantly.

Memory system 4000 can also be applied to devices such as PDAs, portable computers, web tablets, wireless phones, mobile phones, digital music players, and so on.

Figure 27:
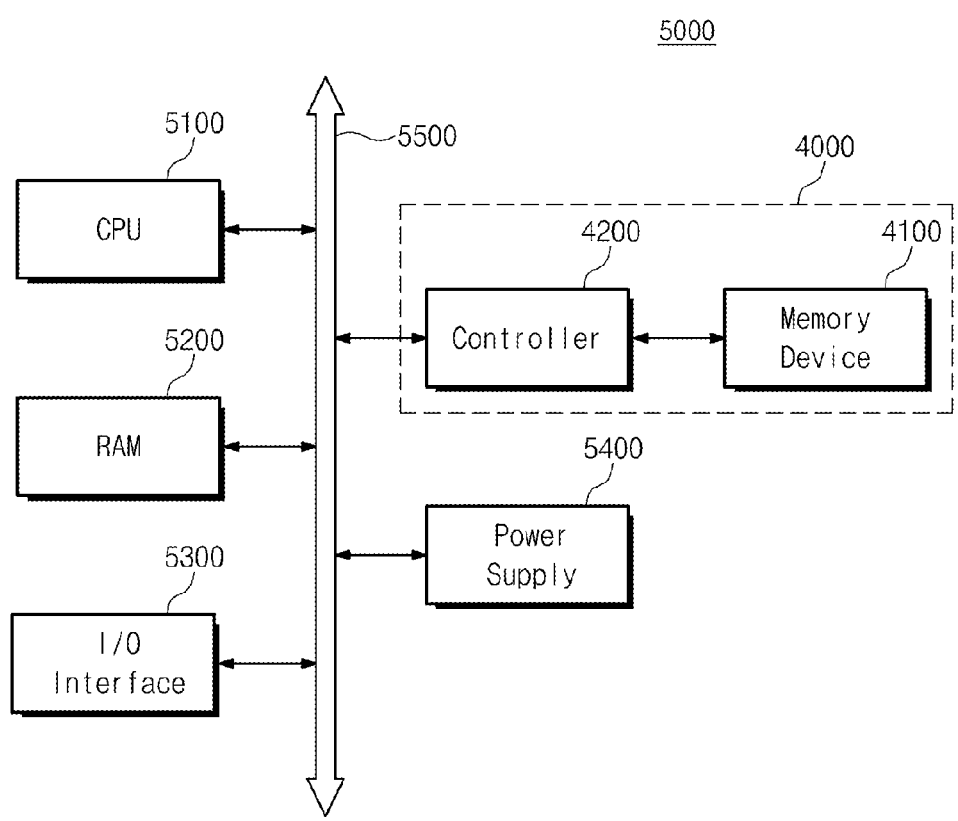
FIG. 27 is a block diagram illustrating a computing system comprising the memory system of FIG. 26, according to an embodiment of the inventive concept.

FIG. 27 is a block diagram illustrating a computing system 5000 comprising the memory system of FIG. 26, according to an embodiment of the inventive concept.

Referring to FIG. 27, computing system 5000 comprises a central processing device 5100, a RAM 5200, an input/output interface 5300, a power supply 5400, and a memory system 4000.

Memory system 4000 is electrically connected to central processing device 5100, RAM 5200, input/output interface 5300, and power supply 5400 through a system bus 5500.

Data provided through input/output interface 5300 or processed by central processing unit 5100 is stored in memory system 4000. Memory system 4000 comprises a controller 4200 and a nonvolatile memory device 4100.

RAM 5200 may be an operating memory of computing system 5000. RAM 5200 may comprise the memory device or the sense amplifier described with reference to FIGS. 1 through 24. RAM 5200 may operate on according to methods described with reference to FIGS. 1 through 24. RAM 5200 may comprise a memory module as described with reference to FIG. 25.

Figure 28:
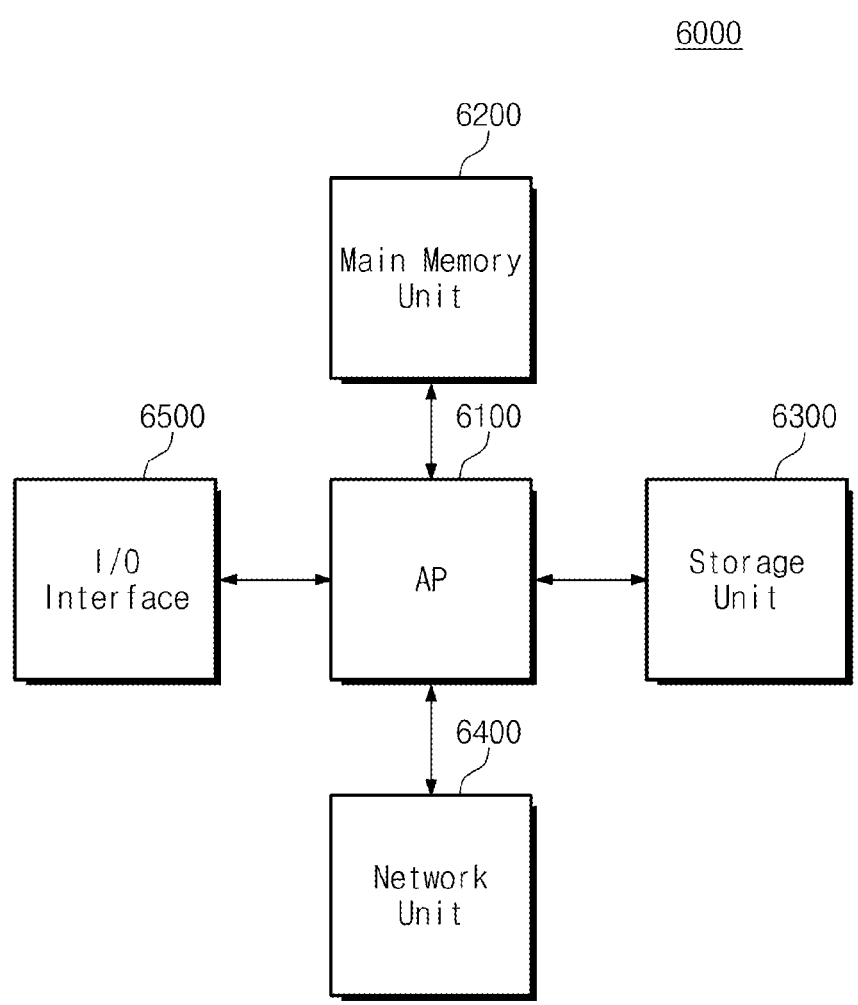
FIG. 28 is a block diagram illustrating a user system comprising a memory device, according to an embodiment of the inventive concept.

FIG. 28 is a block diagram illustrating a user system 6000 comprising a memory device according to an embodiment of the inventive concept.

Referring to FIG. 28, user system 6000 can be provided as one of computing systems such as an ultra mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a digital multimedia broadcasting (DMB) player, a digital audio recorder, a digital audio player, a digital picture recorder, a digital picture player, a digital video recorder, a digital video player.

User system 6000 comprises an application processor 6100, a main storage unit 6200, an auxiliary storage unit 6300, a network unit 6400, and an input/output interface 6500. Application processor 6100 can drive constituent elements in user system 6000, and an operating system (OS). Application processor 6100 may comprise controllers controlling constituent elements in user system 6000, and an interface.

Main storage unit 6200 may be an operation memory of user system 6000. Main storage unit 6200 may be a buffer memory for compensating a speed difference between application processor 6100 and auxiliary storage unit 6300. Main storage unit 6200 may be provided as a random access memory device such as a DRAM, a SDRAM, a SRAM, a DDR SDRAM, a DDR2 SDRAM, a DDR3 SDRAM, a phase change RAM (PRAM), a magnetic RAM (MRAM), a resistive RAM (RRAM), etc. Main storage unit 6200 may comprise the memory device or the sense amplifier described with reference to FIGS. 1 through 24. Main storage unit 6200 may operate using methods described with reference to FIGS. 1 through 24.

Auxiliary storage unit 6300 can store data, such as that received from an external device. Auxiliary storage unit 6300 can transmit data stored in auxiliary storage unit 6300 to application processor 6100. Auxiliary storage unit 6300 may be provided as a mass storage magnetic disk such as a mass storage semiconductor memory device or a hard disk drive (HDD) such as a DRAM, a SDRAM, a SRAM, a DDR SDRAM, a DDR2 SDRAM, a DDR3 SDRAM, a phase change RAM (PRAM), a magnetic RAM (MRAM), a resistive RAM (RRAM), a NAND flash, a NOR flash, etc.

Network unit 6400 performs a communication with external devices. Network unit 6400 can support a wireless communication such as a code division multiple access (CDMA), a global system for mobile communication (GSM), a wideband CDMA (WCDMA), a CDMA-2000, a time division multiple access (TDMA), a long term evolution (LTE), a Wimax, a WLAN, UWB, Bluetooth, a WI-DI, etc.

Input/output interface 6500 provides an interface inputting or outputting data or command to user system 6000. Input/output interface 6500 can be provided as input/output devices such as a camera, a touch screen, an operation recognition module, a mike, a display, a speaker, etc.

According to the above description, a sense amplifier sequentially performs a precharging operation, an offset cancelling operation, a charge sharing operation, a pre-sensing operation, and a restoring operation. The sense amplifier compensates for an offset of the sense amplifier on the basis of the offset cancelling operation and reduces a coupling effect between bitlines on the basis of the pre-sensing operation. Accordingly, the sense amplifier can improve an effective sensing margin. Thus, a sense amplifier having improved performance and a memory device to which the sense amplifier is applied are provided. Where the sense amplifier is applied to a memory device having an open bitline structure, a sensing operation can be performed using a capacitor instead of a dummy array. Thus, because a dummy array of the memory device having an open bitline structure is removed, a memory device having reduced cost and area is provided.

The foregoing is illustrative of embodiments and is not to be construed as limiting thereof. Although a few embodiments have been described, those skilled in the art will readily appreciate that many modifications are possible in the embodiments without materially departing from the scope of the inventive concept. Accordingly, all such modifications are intended to be included within the scope of the inventive concept as defined by the claims.

What is claimed is:

1. A sense amplifier, comprising:
   a first PMOS transistor configured to connect a complementary sensing bitline with a line of a first control signal in response to a sensing bitline;
   a second PMOS transistor configured to connect the sensing bitline with the line of the first control signal in response to the complementary sensing bitline;
   a first NMOS transistor configured to connect the complementary sensing bitline with a line of a second control signal in response to a bitline;
   a second NMOS transistor configured to connect the sensing bitline with the line of the second control signal in response to a complementary bitline;
   a first isolation switch configured to connect the bitline with the sensing bitline in response to an isolation signal;
   a second isolation switch configured to connect the complementary bitline with the complementary sensing bitline in response to the isolation signal;
   a first offset cancellation switch configured to connect the bitline with the complementary sensing bitline in response to an offset cancellation signal; and
   a second offset cancellation switch configured to connect the complementary bitline with the sensing bitline in response to the offset cancellation signal.

2. The sense amplifier of claim 1, wherein during a precharge operation, the first and second isolation switches are configured to be turned on under control of the isolation signal and the first and second offset cancellation switches are configured to be turned on according to the offset cancellation signal, to precharge the bitline, the complementary bitline, the sensing bitline and the complementary sensing bitline to a precharge voltage.

3. The sense amplifier of claim 1, wherein during an offset cancellation operation, the first and second isolation switches are configured to be turned off according to the isolation signal, and the first and second offset cancellation switches are configured to be turned on according to the offset cancellation signal to charge or discharge the bitline by an offset due to the first and second PMOS transistors and the first and second NMOS transistors.

4. The sense amplifier of claim 3, wherein during the offset cancellation operation, the first control signal is an input voltage and the second control signal is a ground voltage.

5. The sense amplifier of claim 1, wherein during a charge sharing operation, the first and second isolation switches are configured to be turned off according to the isolation signal and the first and second offset cancellation switches are configured to be turned off according to the offset cancellation signal, to charge or discharge the bitline by a predetermined level based on charge sharing of charges of the bitline and charges of a memory cell connected to the bitline.

6. The sense amplifier of claim 5, further comprising an equalizing circuit configured to charge the sensing bitline and the complementary sensing bitline to a precharge voltage in response to an equalizing signal while the charge sharing operation is performed.

7. The sense amplifier of claim 6, wherein the equalizing circuit comprises first to third equalizing switches that operate in response to the equalizing signal,
wherein the first and second equalizing switches are connected in series between the sensing bitline and the complementary sensing bitline, and
wherein the third equalizing switch is connected between the sensing bitline and the complementary sensing bitline.

8. The sense amplifier of claim 1, wherein during a pre-sensing operation, the first and second isolation switches are configured to be turned off under control of the isolation signal, the first and second offset cancellation switches are configured to be turned off according to control of the offset cancellation signal, the first control signal is an input voltage and the second control signal is a ground voltage to charge or discharge the sensing bitline and the complementary sensing bitline to the input voltage or the ground voltage according to a voltage variation of the bitline.

9. The sense amplifier of claim 1, wherein during a restoring operation, the first and second isolation switches are configured to be turned on according to control of the isolation signal and the first and second offset cancellation switches are configured to be turned off under control of the offset cancellation signal to store data in a memory cell based on a voltage level of the sensing bitline.

10. A sense amplifier comprising:
a first PMOS transistor configured to connect a complementary sensing bitline with a line of a first control signal in response to a sensing bitline;
a second PMOS transistor configured to connect the sensing bitline with the line of the first control signal in response to the complementary sensing bitline;
a first NMOS transistor configured to connect the complementary sensing bitline with a line of a second control signal in response to a bitline;
a second NMOS transistor configured to connect the sensing bitline with a line of a third control signal in response to a complementary bitline;
a first isolation switch configured to connect the bitline with the sensing bitline in response to an isolation signal;
a second isolation switch configured to connect the complementary bitline with the complementary sensing bitline in response to the isolation signal;
a first offset cancellation switch configured to connect the bitline with the complementary sensing bitline in response to an offset cancellation signal; and
a second offset cancellation switch configured to connect the complementary bitline with the sensing bitline in response to the offset cancellation signal,
wherein the second control signal comprises the third control signal and interconnection resistance noise.

11. A memory device comprising:
a memory cell array comprising multiple memory blocks;
multiple sense amplifiers configured to be connected to the memory blocks and having an open bitline structure; and
a reference voltage unit disposed at an edge area of the memory cell array and connected to sense amplifiers from among the sense amplifiers that are adjacent to the edge area,
wherein each of the sense amplifiers comprises
a sense amplifying unit configured to be connected to a bitline and a complementary bitline, to sense a voltage change of the bitline in response to first and second control signals, and to control voltages of a sensing bitline and a complementary sensing bitline based on the sensed voltage change;
a first isolation switch configured to connect the bitline with the sensing bitline in response to an isolation signal;
a second isolation switch configured to connect the complementary bitline with the complementary sensing bitline in response to the isolation signal;
a first offset cancellation switch configured to connect the bitline with the complementary sensing bitline in response to an offset cancellation signal; and
a second offset cancellation switch configured to connect the complementary bitline with the sensing bitline in response to the offset cancellation signal, and
wherein the reference voltage unit comprises multiple capacitors, and wherein the sense amplifiers adjacent to the edge area are configured to charge the capacitors to a precharge voltage.

12. The memory device of claim 11, wherein during an offset cancelling operation, the sense amplifiers are configured to cut off connection between a respective bitline and a respective sensing bitline and connection between a respective complementary bitline and a respective complementary sensing bitline according to control of the isolation signal and to maintain connection between the respective bitline and the respective complementary sensing bitline and connection between the respective complementary bitline and the respective sensing bitline according to control of the offset cancellation signal,
wherein during the offset cancelling operation the respective bitline is charged or discharged by an offset of the sense amplifiers.

13. The memory device of claim 11, wherein during a pre-sensing operation, the first control signal transitions to an input voltage, the second control signal transitions to a ground voltage, and the sense amplifiers are configured to cut off connection between a respective bitline and a respective sensing bitline and connection between a respective complementary bitline and a respective complementary sensing bitline according to control of the isolation signal and to cut off connection between the respective bitline and the respective complementary sensing bitline and connection between the respective complementary bitline and the respective sensing bitline according to control of the offset cancellation signal, and
wherein during the pre-sensing operation, voltage levels of the respective sensing bitline and the respective complementary sensing bitline are amplified or reduced based on a voltage variation of the respective bitline.

* * * * *